(12) United States Patent
Healey et al.

(10) Patent No.: US 8,725,307 B2
(45) Date of Patent: May 13, 2014

(54) SYSTEM AND METHOD FOR MEASUREMENT AIDED PREDICTION OF TEMPERATURE AND AIRFLOW VALUES IN A DATA CENTER

(75) Inventors: Christopher Healey, Chelmsford, MA (US); Xuanhang Zhang, Tewksbury, MA (US); James W. VanGilder, Pepperell, MA (US)

(73) Assignee: Schneider Electric IT Corporation, West Kingston, RI (US)

( * ) Notice: Subject to any disclaimer, the term of this patent is extended or adjusted under 35 U.S.C. 154(b) by 179 days.

(21) Appl. No.: 13/171,152

(22) Filed: Jun. 28, 2011

(65) Prior Publication Data

US 2013/0006426 A1  Jan. 3, 2013

(51) Int. Cl.
*G05D 23/00* (2006.01)
*H05K 7/20* (2006.01)

(52) U.S. Cl.
CPC ................................. *H05K 7/20836* (2013.01)
USPC .................... 700/300; 703/2; 703/6; 361/694

(58) Field of Classification Search
CPC .................................................. H05K 7/20836
USPC ...................... 700/278, 282, 300; 703/1, 2, 6; 702/181; 454/184; 361/694–696, 679
See application file for complete search history.

(56) References Cited

U.S. PATENT DOCUMENTS

| | | | |
|---|---|---|---|
| 4,823,290 A | 4/1989 | Fasack et al. | |
| 5,095,712 A | 3/1992 | Narreau | |

(Continued)

FOREIGN PATENT DOCUMENTS

| | | |
|---|---|---|
| CN | 1485906 A | 3/2004 |
| WO | 2005122664 A1 | 12/2005 |

(Continued)

OTHER PUBLICATIONS

"Case Study, Application of TileFlow to Improve Cooling in a Data Center," Innovative Research, Inc., 2004.

(Continued)

*Primary Examiner* — Dave Robertson
(74) *Attorney, Agent, or Firm* — Lando & Anastasi, LLP

(57) ABSTRACT

A system and method for evaluating cooling performance of equipment in a data center, the equipment including a plurality of equipment racks and at least one cooling provider. In one aspect, a method includes receiving a plurality of measured inlet and exhaust air temperature values for the at least one cooling provider and a subset of the plurality of equipment racks, implementing a cooling model, the model including an ambient air temperature value, a plurality of inlet and exhaust air temperature values for the plurality of equipment racks and the at least one cooling provider, and a plurality of airflow values for the plurality of equipment racks and the at least one cooling provider, adjusting at least one of the ambient air temperature value and each of the plurality of airflow values in the cooling model, adjusting the cooling model to compensate for the adjusted at least one of the ambient air temperature value and each of the plurality of airflow values in the cooling model, substituting a first subset of the plurality of inlet and exhaust air temperature values in the cooling model with the plurality of measured inlet and exhaust air temperature values, and predicting a second subset of the plurality of inlet and exhaust air temperature values for the plurality of equipment racks and the at least one cooling provider in the cooling model.

18 Claims, 18 Drawing Sheets

(56) References Cited

U.S. PATENT DOCUMENTS

| | | | |
|---|---|---|---|
| 5,216,623 A | 6/1993 | Barrett et al. | |
| 5,367,670 A | 11/1994 | Ward et al. | |
| 5,410,448 A | 4/1995 | Barker, III et al. | |
| 5,581,478 A | 12/1996 | Cruse et al. | |
| 5,718,628 A | 2/1998 | Nakazato et al. | |
| 5,735,134 A | 4/1998 | Liu et al. | |
| 6,055,480 A | 4/2000 | Nevo et al. | |
| 6,134,511 A | 10/2000 | Subbarao | |
| 6,216,956 B1 | 4/2001 | Ehlers et al. | |
| 6,246,969 B1 | 6/2001 | Sinclair et al. | |
| 6,494,050 B2 | 12/2002 | Spinazzola et al. | |
| 6,574,104 B2 | 6/2003 | Patel et al. | |
| 6,672,955 B2 | 1/2004 | Charron | |
| 6,694,759 B1 | 2/2004 | Bash et al. | |
| 6,718,277 B2 | 4/2004 | Sharma | |
| 6,745,579 B2 | 6/2004 | Spinazzola et al. | |
| 6,827,142 B2 | 12/2004 | Winkler et al. | |
| 6,853,097 B2 | 2/2005 | Matsuda et al. | |
| 7,020,586 B2 | 3/2006 | Snevely | |
| 7,031,870 B2 | 4/2006 | Sharma et al. | |
| 7,051,946 B2 | 5/2006 | Bash et al. | |
| 7,085,133 B2 | 8/2006 | Hall | |
| 7,148,796 B2 | 12/2006 | Joy et al. | |
| 7,251,547 B2 | 7/2007 | Bash et al. | |
| 7,313,503 B2 | 12/2007 | Nakagawa et al. | |
| 7,315,448 B1 | 1/2008 | Bash et al. | |
| 7,365,973 B2 | 4/2008 | Rasmussen et al. | |
| 7,366,632 B2 | 4/2008 | Hamann et al. | |
| 7,378,165 B2 | 5/2008 | Brignone et al. | |
| 7,403,391 B2 | 7/2008 | Germagian et al. | |
| 7,426,453 B2 | 9/2008 | Patel et al. | |
| 7,472,043 B1 | 12/2008 | Low et al. | |
| 7,558,649 B1 | 7/2009 | Sharma et al. | |
| 7,568,360 B1 | 8/2009 | Bash et al. | |
| 7,596,476 B2 | 9/2009 | Rasmussen et al. | |
| 7,620,480 B2 | 11/2009 | Patel et al. | |
| 7,676,280 B1 | 3/2010 | Bash et al. | |
| 7,726,144 B2 | 6/2010 | Larson et al. | |
| 7,799,474 B2 | 9/2010 | Lyon et al. | |
| 7,881,910 B2 | 2/2011 | Rasmussen et al. | |
| 7,885,795 B2 | 2/2011 | Rasmussen et al. | |
| 7,908,126 B2* | 3/2011 | Bahel et al. | 703/6 |
| 7,979,250 B2 | 7/2011 | Archibald et al. | |
| 8,155,922 B2* | 4/2012 | Loucks | 702/182 |
| 8,219,362 B2* | 7/2012 | Shrivastava et al. | 703/1 |
| 8,228,046 B2 | 7/2012 | Ingemi et al. | |
| 8,244,502 B2* | 8/2012 | Hamann et al. | 703/1 |
| 8,249,825 B2 | 8/2012 | VanGilder et al. | |
| 8,425,287 B2* | 4/2013 | Wexler | 454/184 |
| 8,473,265 B2* | 6/2013 | Hlasny et al. | 703/6 |
| 8,509,959 B2* | 8/2013 | Zhang et al. | 700/299 |
| 2001/0042616 A1 | 11/2001 | Baer | |
| 2002/0043969 A1 | 4/2002 | Duncan et al. | |
| 2002/0071031 A1 | 6/2002 | Lord et al. | |
| 2002/0149911 A1 | 10/2002 | Bishop et al. | |
| 2003/0115000 A1 | 6/2003 | Bodas | |
| 2003/0115024 A1 | 6/2003 | Snevely | |
| 2003/0158718 A1 | 8/2003 | Nakagawa et al. | |
| 2003/0232598 A1 | 12/2003 | Aljadeff et al. | |
| 2004/0020224 A1 | 2/2004 | Bash et al. | |
| 2004/0065097 A1 | 4/2004 | Bash et al. | |
| 2004/0065104 A1 | 4/2004 | Bash et al. | |
| 2004/0075984 A1 | 4/2004 | Bash et al. | |
| 2004/0089009 A1 | 5/2004 | Bash et al. | |
| 2004/0089011 A1 | 5/2004 | Patel et al. | |
| 2004/0189161 A1 | 9/2004 | Davis et al. | |
| 2004/0240514 A1 | 12/2004 | Bash et al. | |
| 2004/0242197 A1 | 12/2004 | Fontaine | |
| 2004/0262409 A1 | 12/2004 | Crippen et al. | |
| 2005/0023363 A1 | 2/2005 | Sharma et al. | |
| 2005/0063542 A1 | 3/2005 | Ryu | |
| 2005/0267639 A1 | 12/2005 | Sharma et al. | |
| 2006/0080001 A1 | 4/2006 | Bash et al. | |
| 2006/0096306 A1 | 5/2006 | Okaza et al. | |
| 2006/0115586 A1 | 6/2006 | Xing et al. | |
| 2006/0214014 A1 | 9/2006 | Bash et al. | |
| 2007/0019569 A1 | 1/2007 | Park et al. | |
| 2007/0078635 A1* | 4/2007 | Rasmussen et al. | 703/1 |
| 2007/0121295 A1 | 5/2007 | Campbell et al. | |
| 2007/0171613 A1 | 7/2007 | McMahan et al. | |
| 2007/0174024 A1 | 7/2007 | Rasmussen et al. | |
| 2007/0190919 A1 | 8/2007 | Donovan et al. | |
| 2007/0274035 A1 | 11/2007 | Fink et al. | |
| 2008/0041076 A1 | 2/2008 | Tutunoglu et al. | |
| 2008/0104985 A1 | 5/2008 | Carlsen | |
| 2008/0105412 A1 | 5/2008 | Carlsen et al. | |
| 2008/0174954 A1 | 7/2008 | VanGilder et al. | |
| 2008/0180908 A1 | 7/2008 | Wexler | |
| 2009/0030554 A1 | 1/2009 | Bean, Jr. et al. | |
| 2009/0138313 A1 | 5/2009 | Morgan et al. | |
| 2009/0138888 A1 | 5/2009 | Shah et al. | |
| 2009/0150123 A1 | 6/2009 | Archibald et al. | |
| 2009/0205416 A1 | 8/2009 | Campbell et al. | |
| 2009/0223234 A1 | 9/2009 | Campbell et al. | |
| 2009/0259343 A1 | 10/2009 | Rasmussen et al. | |
| 2009/0309570 A1 | 12/2009 | Lehmann et al. | |
| 2009/0326884 A1* | 12/2009 | Amemiya et al. | 703/6 |
| 2010/0106464 A1 | 4/2010 | Hlasny et al. | |
| 2010/0256959 A1 | 10/2010 | VanGilder et al. | |
| 2010/0286956 A1 | 11/2010 | VanGilder et al. | |
| 2010/0287018 A1 | 11/2010 | Shrivastava et al. | |
| 2011/0040529 A1 | 2/2011 | Hamann et al. | |
| 2012/0071992 A1 | 3/2012 | VanGilder et al. | |
| 2012/0158387 A1 | 6/2012 | VanGilder et al. | |
| 2012/0170205 A1 | 7/2012 | Healey et al. | |
| 2013/0006426 A1 | 1/2013 | Healey et al. | |

FOREIGN PATENT DOCUMENTS

| | | |
|---|---|---|
| WO | 2006119248 A2 | 11/2006 |
| WO | 2006124240 A2 | 11/2006 |
| WO | 2007095144 A2 | 8/2007 |
| WO | 2008144375 A2 | 11/2008 |
| WO | 2009/014893 A1 | 1/2009 |
| WO | 2010023619 A1 | 3/2010 |
| WO | 2011/019615 A1 | 2/2011 |
| WO | 2012037427 A1 | 3/2012 |
| WO | 2012082985 A2 | 6/2012 |
| WO | 2012135038 A1 | 10/2012 |

OTHER PUBLICATIONS

"Management Strategy for Network Critical Physical Infrastructure", White Paper #100, pp. 110, American Power Conversion, Dec. 15, 2003, published on World Wide Web.

Abi-Zadeh, Davar et al., "A Transient Analysis of Environmental Conditions for a Mission Critical Facility after a Failure of Power", Arup Mission Criticial Facilities, Feb. 2001, pp. 1-12.

Ahmad, Jasim U. et al, "Navier-Stokes simulation of air-conditioning facility of a large modern computer room," Jun. 2005, Proceedings of the 2005 ASME Fluids Engineering Division Summer Meeting and Exhibition, pp. 1-6.

Anderson, Donald, "Iterative Procedures for Nonlinear Integral Equations," Journal of the Association for Computing Machinery, vol. 12, No. 4, Oct. 1965, pp. 547-560.

APC User's Guide Brochure, "InfraStruXure Manager," Mar. 2004, 181 pgs.

Ashrae, "Thermal Guidelines for Data Processing Environments" 2004, Atlanta: American Society of Heating, Refrigerating, and Air-Conditioning Engineers, Inc., 2004, Atlanta.

Bash, C.E., Patel, C.D., and Sharma, R.K., "Efficient Thermal Management of Data Centers—Immediate and Long-Term Research Needs" Intl. J. Heat, Ventilating, Air-Conditioning and Refrigeration Research, 2003, pp. 137-152, vol. 9, No. 2.

Beitelmal et al., "Thermo-Fluids Provisioning of a High Performance High Density Data Center", Apr. 22, 2006, Springer Science and Business Media, Inc, Distributed and Parallel Databases, 21, pp. 227-238 DOI:1 0.1 007/s1 0619-005-0413-0.

Chandrakant D. Patel, et al., "Thermal Considerations in Cooling Large Scale High Copute Density Data Centers" IEEE 2002, pp. 767-776.

(56) References Cited

OTHER PUBLICATIONS

Dvinsky: "Hot Tips for Using Cooling Software a Little Planning Lets Users Get More from Their Thermal-Simulation Software", Machine Design, Penton Media, Cleveland, OH, vol. 72, No. 4, Feb. 24, 2000.

Ehsan Pakabaznia et al., "Miminizing data center cooling and server power costs", Proceedings of the 14th ACM/IEEE International Symposium on Low Power Electronics and Design, ISLPED '09, Jan. 1, 2009, p. 145, XP55015368, New York, New York, USA, DOI: 10.1145/1594233.1594268, ISBN: 978-1-60-558684-7.

Herrlin, M.K., "Rack Cooling Effectiveness in Data Centers and Telecom Central Offices: The Rack Cooling Index (RCI)," ASHRAE Transaction, 2005, pp. 725-731, vol. 111(2).

Innovative Research, Inc., http://web.archive.org/web/20051221005029/http://www.inres.com/, Dec. 21, 2005, published on World Wide Web.

International Search Report and Written Opinion of the International Searching Authority from corresponding PCT/US2012/044419 mailed Dec. 18, 2012.

International Search Report for PCT/US2006/16739 mailed Oct. 3, 2006.

Jeffrey Rambo et al., "Modeling of data center airflow and heat transfer: State of the art and future trends", Distributed and Parallel Databases, Kluwer Academic Publishers, BO, vol. 21, No. 2-3, Jan. 20, 2007, pp. 193-225, XP019499845, ISSN: 1573-7578, DOI:10.1007/S10619-006-7007-3.

Jeonghwan Choi et al., "A CFD-Based Tool for Studying Temperature in Rack-Mounted Servers", IEEE Transactions on Computers, IEEE Service Center, Los Alamitos, CA, US, vol. 57, No. 8, Aug. 1, 2008, pp. 1129-1142, ISSN: 0018-9340, DOI: 10.1109/TC.2008.52.

K. Dunlap, "Cooling Audit for Identifying Potential Cooling Problems in Data Centers", White Paper #40, pp. 1-18, American Power Conversion, May 20, 2004, published on World Wide Web.

Karki et al., "Techniques for controlling airflow distribution in raised-floor data centers," ASME 2003.

Marwah, M.; Sharma, R.; Shih, R.; Patel, C.; Bhatia, V.; Mekanapurath, M.; Velumani, R.; Velayudhan, S., 2009, Data analysis, visualization and knowledge discovery in sustainable data centers, In Proceedings of the 2nd Bangalore Annual Compute Conference (Compute '09).

N. Rasmussen, "Calculating Total Cooling Requirements for Data Centers", White Paper #25, pp. 1-8, American Power Conversion, May 20, 2004, published on World Wide Web.

N. Rasmussen, "Cooling Strategies for Ultra-High Density Racks and Blade Servers", White Paper #46, pp. 1-22, American Power Conversion, Mar. 29, 2005, published on World Wide Web.

N. Rasmussen, "Strategies for Deploying Blade Servers in Existing Data Centers", White Paper #125, pp. 1-14, American Power Conversion, Mar. 29, 2005, published on World Wide Web.

Pakbaznia, E.; Ghasemazar, M.; Pedram, M.:, "Temperature-aware dynamic resource provisioning in a power-optimized datacenter," Design, Automation & Test in Europe Conference & Exhibition (Date), 2010, vol., No., pp. 124-129, Mar. 8-12, 2010.

Refai-Ahmed G. et al., "Analysis of flow distribution in power supply using flow network modeling (FNM)", Thermal and Thermomechanical Phenomena in Electronic Systems, 2000, IT Herm 2000, The Seventh Intersociety Conference on May 23-26, 2000, Piscataway, NJ, USA, IEEE, Piscataway, NJ, USA, vol. 1, May 23, 2000, pp. 90-98, ISBN: 978-0/7803-5912-3.

Sharma, R.K, Bash, C.E., and Patel, C.D, "Dimensionless Parameters for Evaluation of Thermal Design and Performance of Large-Scale Data Centers." 8th ASME/AIAA Joint Thermophysics and Heat Transfer Conference, Jun. 24-26, 2002. St. Louis, Missouri.

Shrivastava S K et al., Optimization of Cluster Cooling Performance for Data Centers, Thermal and Thermomechanical Phenomena in Electronic Systems, May 28, 2008, pp. 1161-1166, 11th Intersociety Conference on, IEEE, Piscataway, NJ.

Shrivastava S.K. et al., "A flow-network model for predicting rack cooling in containment systems", Proceedings of the ASME Interpack Conference—2009: Presented at 2009 ASME Interpack Conference, Jul. 19-23, 2009, San Francisco, California, USA, vol. 2, Jul. 19, 2009, pp. 785-791.

Toulouse M.M. et al., "Exploration of a potential-flow-based compact model of air-flow transport in data centers", Proceedings of the ASME International Mechanical Engineering Congress and Exposition—2009: Presented at 2009 ASME International Mechanical Engineering Congress and Exposition, Nov. 13-19, 2009, Lake Buena Vista, Florida, USA, vol. 13: New Del, vol. 13, Jan. 1, 2009, pp. 41-50, DOI: 10.1115/IMECE2009-10806, ISBN: 978-0-7918-4386-4.

Vanessa Lopez et al, "Measurement-based modeling for data centers", Thermal and Thermomechanical Phenomena in Electronic Systems (ITHERM), 2010 12th IEEE Intersociety Conference on, IEEE, Piscataway, NJ, USA, Jun. 2, 2010, pp. 1-8, XP031702357.

VanGilder et al., "Airflow Uniformity thourhg Perforated Tiles in a Raised-Floor Data Center", White Paper 121, Jul. 17-22, 2005, 10 pages.

VanGilder, James W. et al., "Caputure index: an airflow-based rack cooling performance metric," 2007, ASHRAE Transactions, vol. 113, pp. 126-136.

VanGilder, James W. et al., "Real-Time prediction of rack-cooling performance," 2006, ASHRAE Transactions, vol. 112, pp. 151-162.

VanGilder, James, W., et al., "Real-time prediction of rack-cooling performance," 2006, ASHRAE Transactions, vol. 112, pp. 151-162.

VanGilder, James, W., et al., "Capture index: an airflow-based rack cooling performance metric," 2007, ASHRAE Transactions, vol. 113, pp. 126-136.

Search Report from corresponding Chinese Application No. 200800234492 dated Feb. 20, 2013.

Australian Patent Examination Report No. 1 for Australian Patent Application No. 2009324936 issued Apr. 22, 2013, 3 pages.

Texas Instruments Incorporated, "A True System-on-Chip Solution for 2A GHz IEEE 802.15.4 and ZigBee Applications," CC2530F32, CC2530F64, CC2530F128, CC2530F256, Apr. 2009—Revised Feb. 2011, www.ti.com, pp. 36.

Baronti et al. "Wireless Sensor Networks: A Survey on the State of the Art and the 802.15.4 and ZigBee Standards". Computer Communications, Elsevier Science Publishers B.V. Amsterdam, NL. vol. 30, No. 7. Apr. 8, 2007. pp. 1655-1695.

Chen et al. "Analysis of the Key Agreement Scheme of ZigBee Standard". E-Business and Information System Security (E-BISS), 2010 2nd International Conference on IEEE, Pscataway, NJ USA. May 22, 2010.

International Search Report for PCT/US2011/063668 dated Mar. 20, 2012.

Healey, C., et al., "Potential-Flow Modeling for Data Center Applications," Proceedings of the ASME 2011 Pacific Rim Technical Conference & Exposition on Packaging and Integration of Electronic and Photonic Systems, IPACK2011-52136, Jul. 6-8, 2011.

Chen, Q.and Srebric, J., "Simplified Diffuser Boundary Conditions for Numerical Room Airflow Models," Final Report for ASHRAE RP-1009, Department of Architecture, Massachusetts Institute of Technology, Cambridge, MA, 2000, 181 pages.

* cited by examiner

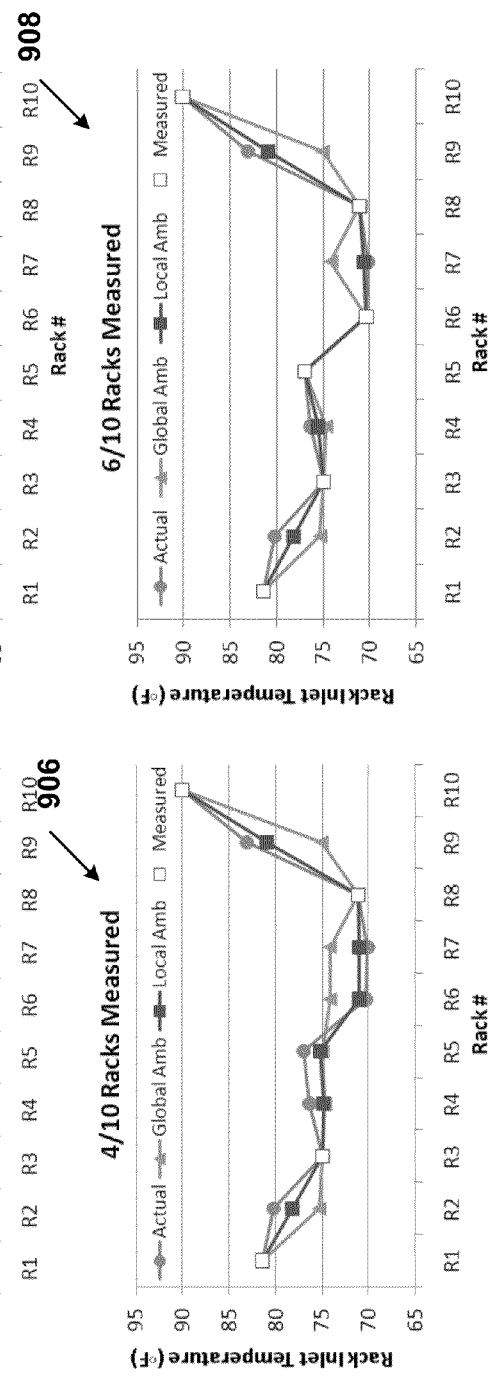
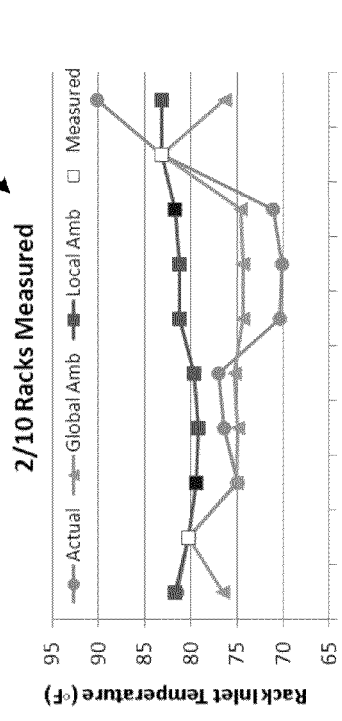
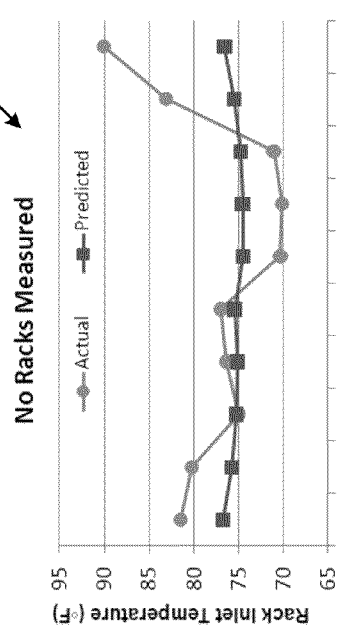
FIG. 9

SYSTEM AND METHOD FOR MEASUREMENT AIDED PREDICTION OF TEMPERATURE AND AIRFLOW VALUES IN A DATA CENTER

BACKGROUND

1. Field of the Invention

At least one embodiment in accordance with the present invention relates generally to systems and methods for data center management and design, and more specifically, to systems and methods for incorporating measured data into predictive models of characteristics of a data center.

2. Discussion of Related Art

In response to the increasing demands of information-based economies, information technology networks continue to proliferate across the globe. One manifestation of this growth is the centralized network data center. A centralized network data center typically consists of various information technology equipment, collocated in a structure that provides network connectivity, electrical power and cooling capacity. Often the equipment is housed in specialized enclosures termed "racks" which integrate these connectivity, power and cooling elements. In some data center configurations, these rows are organized into hot and cold aisles to decrease the cost associated with cooling the information technology equipment. A raised floor having an air plenum beneath the floor is typically used for providing cooling air to the racks. Cool air is distributed from the air plenum to the racks through perforated tiles having open areas.

Various processes and software applications, such as the data center management systems available from American Power Conversion (APC) Corporation of West Kingston, R.I., have been developed to aid data center personnel in designing and maintaining efficient and effective data center configurations. These tools often guide data center personnel through activities such as designing the data center structure, positioning equipment within the data center prior to installation and repositioning equipment after construction and installation are complete. Thus, conventional tool sets provide data center personnel with a standardized and predictable design methodology.

SUMMARY OF THE INVENTION

A first aspect of the invention is directed to a computer-implemented method for evaluating cooling performance of equipment in a data center, the equipment including a plurality of equipment racks and at least one cooling provider. The method includes receiving a plurality of measured inlet and exhaust air temperature values for the at least one cooling provider and a subset of the plurality of equipment racks, and implementing a cooling model. The cooling model may be a real-time cooling model. The cooling model may also be a predictive cooling model. The cooling model may further be a room temperature model. The model may include an ambient air temperature value, a plurality of inlet and exhaust air temperature values for the plurality of equipment racks and the at least one cooling provider, and a plurality of airflow values for the plurality of equipment racks and the at least one cooling provider. The method further includes adjusting at least one of (a) the ambient air temperature value and (b) each of the plurality of airflow values in the cooling model, adjusting the cooling model to compensate for the adjusted at least one of (a) the ambient air temperature value and (b) each of the plurality of airflow values in the cooling model, substituting a first subset of the plurality of inlet and exhaust air temperature values in the cooling model with the plurality of measured inlet and exhaust air temperature values, and predicting a second subset of the plurality of inlet and exhaust air temperature values for the plurality of equipment racks and the at least one cooling provider in the cooling model.

In the method, adjusting the cooling model to compensate for the adjusted ambient air temperature value may further include establishing an equal ambient temperature value for each equipment rack, and the at least one cooling provider, and including the airflow between the at least one cooling provider and each of the equipment racks. The method may further include determining whether the inlet and exhaust air temperature values of each of the equipment racks and the at least one cooling provider pass error checking as a result of adjusting the cooling model.

In the method, adjusting the cooling model to compensate for the adjusted ambient air temperature value may further comprise establishing different ambient temperature values for each of the plurality of equipment racks and the at least one cooling provider. The method may further include determining whether the inlet and exhaust air temperature values of each of the equipment racks and the at least one cooling provider pass error checking as a result of adjusting the cooling model.

In the method, adjusting the cooling model to compensate for the adjusted each of the plurality of airflow values may further include adjusting each of a plurality of airflow percentage values. In the method, adjusting each of a plurality of airflow percentage values may also include determining a set of factors for the plurality of airflow percentage values. In the method, the set of factors reduces a difference between the plurality of measured inlet and exhaust air temperature values and the second subset of the plurality of inlet and exhaust air temperature values. The method may further include determining whether the inlet and exhaust air temperature values of each of the equipment racks and the at least one cooling provider pass error checking as a result of adjusting the cooling model.

Further in the method, receiving a plurality of measured inlet and exhaust air temperature values may further include receiving historically measured inlet and exhaust air temperature values and adjusting the airflow percentages further includes determining a set of factors for the airflow percentages, the set of factors reduces a difference between the historically measured inlet and exhaust air temperature values and the second subset of the plurality of inlet and exhaust air temperature values. The method may further include determining whether the inlet and exit air temperature values of each of the equipment racks and the at least one cooling provider pass error checking as a result of adjusting the plurality of airflow percentage values.

In the method, adjusting the cooling model to compensate for the adjusted each of the plurality of airflow values may further include determining a set of factors for the plurality of airflow values between the at least one cooling provider and each of the plurality of the equipment racks. In the method, the set of factors reduces a difference between the plurality of measured inlet and exhaust air temperature values and the second subset of the plurality of inlet and exhaust air temperature values. The method may further include determining whether the inlet and exit air temperature values of each of the equipment racks and the at least one cooling provider pass error checking as a result of adjusting the third subset of the plurality of airflow values.

The method may further include receiving historically measured inlet and exhaust air temperature values. In the method, adjusting the cooling model to compensate for the adjusted each of the plurality of airflow values may further include determining a set of factors for the plurality of airflow values, the set of factors reduces a difference between the historically measured inlet and exhaust air temperature values and the second subset of the plurality of inlet and exhaust air temperature values. The method may further include determining whether the inlet and exit air temperature values of each of the equipment racks and the at least one cooling provider pass error checking as a result of adjusting the third subset of the plurality of airflow values.

The method may further include receiving a plurality of measured airflow values for each of a plurality of perforated tiles, determining a plurality of estimated airflow values for each of the plurality of perforated tiles, calculating a ratio between the plurality of measured airflow and the plurality of estimated airflow values, and adjusting a leakage factor until a difference between a subset of the plurality of measured airflow and a subset of the plurality of estimated airflow values reaches a threshold. In the method, adjusting the leakage factor further includes determining a damping parameter based on a confidence parameter and a uniformity parameter.

In the method, the cooling model may further include a total rate of airflow provided by at least one computer room air conditioner. The method may further include receiving a plurality of measured airflow values for each of a plurality of perforated tiles, and substituting the total rate of airflow provided by the at least computer room air conditioner with a subset of the plurality of measured airflow values in the cooling model.

Another aspect of the invention is directed to a system for evaluating equipment in a data center, the equipment including a plurality of equipment racks, and at least one cooling provider. The system includes an interface and a controller coupled to the interface and configured to receive a plurality of measured inlet and exhaust air temperature values for the at least one cooling provider and a subset of the plurality of equipment racks, implement a cooling model. The cooling model may be a real-time cooling model. The cooling model may also be a predictive cooling model. The cooling model may further be a room temperature model. In the system, the model may include an ambient air temperature value, a plurality of inlet and an exhaust air temperature values for the plurality of equipment racks and the at least one cooling provider, and a plurality of airflow values for the plurality of equipment racks and the at least one cooling provider, adjust at least one of the ambient air temperature value and each of the plurality of airflow values in the cooling model, adjust the cooling model to compensate for the adjusted at least one of the ambient air temperature value and each of the plurality of airflow values in the cooling model, substitute a first subset of the plurality of inlet and exhaust air temperature values in the cooling model with the plurality of measured inlet and exhaust air temperature values, and predict a second subset of the plurality of inlet and exhaust air temperature values for the plurality of equipment racks and the at least one cooling provider in the cooling model.

In the system, the controller may be further configured to adjust the ambient air temperature value by including an equal ambient temperature value for each equipment rack, and the at least one cooling provider and by including the airflow between the at least one cooling provider and each of the equipment racks in the ambient air temperature value. The controller may be also configured to determine whether the inlet and exhaust temperatures of each of the equipment racks and the at least one cooling provider pass error checking as a result of adjusting the cooling model.

The controller may be further configured to adjust the ambient air temperature value by including different ambient temperature values for each of the plurality of equipment racks and the at least one cooling provider. In the system, the controller may be further configured to determine whether the inlet and exhaust temperatures of each of the equipment racks and the at least one cooling provider pass error checking as a result of adjusting the ambient air temperature values.

In the system, each of the plurality of airflow values may include airflow percentage values. The controller may be also configured to determine a set of factors for the plurality of airflow percentage values. In the system, the set of factors reduces a difference between the plurality of measured inlet and exhaust air temperature values and the second subset of the plurality of inlet and exhaust air temperature values. In the system, the controller may be further configured to determine whether the inlet and exhaust temperatures of each of the equipment racks and the at least one cooling provider pass error checking as a result of adjusting each of the plurality of airflow percentage values.

In the system, the measured inlet and exhaust air temperatures include historically measured inlet and exhaust air temperatures and the controller may be further configured to determine a set of factors for the airflow percentage values. In the system, the set of factors reduces a difference between the historically measured inlet and exhaust air temperature values and the second subset of the plurality of inlet and exhaust temperatures. In the system, the controller may be further configured to determine whether the inlet and exhaust temperatures of each of the equipment racks and the at least one cooling provider pass error checking as a result of adjusting the airflow percentage values.

The controller may be further configured to adjust the airflow values by determining a set of factors for the plurality of airflow values between the at least one cooling provider and each of the equipment racks. In the system, the set of factors reduces a difference between the plurality of measured inlet and exhaust air temperature values and the second subset of the plurality of inlet and exhaust air temperature values. In the system, the controller may be further configured to determine whether the inlet and exhaust temperatures of each of the equipment racks and the at least one cooling provider pass error checking as a result of adjusting the airflow values.

The controller may be further configured to receive historically measured inlet and exhaust air temperature values. The controller may be further configured to adjust the airflow values by determining a set of factors for the plurality of airflow values. In the system, the set of factors reduces a difference between the historically measured inlet and exhaust air temperature values and the second subset of the plurality of inlet and exhaust air temperature values. In the system, the controller may be further configured to determine whether the inlet and exhaust temperatures of each of the equipment racks and the at least one cooling provider pass error checking as a result of adjusting the airflow values.

In the system, the cooling model may further include a total rate of airflow provided by at least one computer room air conditioner and the controller may be further configured to receive a plurality of measured airflow values for each of a plurality of perforated tiles and substitute the total rate of airflow provided by the at least computer room air conditioner with a subset of the plurality of measured airflow values in the cooling model.

In the system, the controller may be further configured to receive a plurality of measured airflow values for each of a plurality of perforated tiles, determine a plurality of estimated airflow values for each of the plurality of perforated tiles, calculate a ratio between the plurality of measured airflow and the plurality of estimated airflow values, and adjust a leakage factor until a difference between a subset of the plurality of measured airflow and a subset of the plurality of estimated airflow values reaches a threshold. In the system, the controller may be further configured to determine a damping parameter based on a confidence parameter and a uniformity parameter.

In the system, the controller may be further configured to receive a plurality of measured airflow values for each of a plurality of perforated tiles, determine a plurality of estimated airflow values for each of the plurality of perforated tiles, calculate a ratio between the plurality of measured airflow and the plurality of estimated airflow values, and adjust a leakage factor until a difference between a subset of the plurality of measured airflow and a subset of the plurality of estimated airflow values reaches a threshold.

Another aspect of the invention is directed to a computer readable medium having stored thereon sequences of instruction including instructions that will cause a processor to receive a plurality of measured inlet and exhaust air temperature values for the at least one cooling provider and a subset of the plurality of equipment racks, implement a cooling model. The cooling model may be a real-time cooling model. The cooling model may also be a predictive cooling model. The cooling model may further be a room temperature model. The cooling model may include an ambient air temperature value, a plurality of inlet and an exhaust air temperature values for the plurality of equipment racks and the at least one cooling provider, and a plurality of airflow values for the plurality of equipment racks and the at least one cooling provider, adjust at least one of the ambient air temperature value and each of the plurality of airflow values in the cooling model, adjust the cooling model to compensate for the adjusted at least one of the ambient air temperature value and each of the plurality of airflow values in the cooling model, substitute a first subset of the plurality of inlet and exhaust air temperature values in the cooling model with the plurality of measured inlet and exhaust air temperature values, and predict a second subset of the plurality of inlet and exhaust air temperature values for the plurality of equipment racks and the at least one cooling provider in the cooling model.

In the computer readable medium, the sequences of instructions may include instructions that will cause the processor to establish equal ambient temperature values for each equipment rack, and the at least one cooling provider and include the airflow between the at least one cooling provider and each of the equipment racks. In addition, the sequences of instructions may further include instructions that will cause the processor to determine whether the inlet and exhaust air temperature values of each of the equipment racks and the at least one cooling provider pass error checking as a result of adjusting the cooling model.

In the computer readable medium, the sequences of instructions may also include instructions that will cause the processor to establish different ambient temperature values for each of the plurality of equipment racks and the at least one cooling provider. The sequences of instructions may further include instructions that will cause the processor to adjust the cooling model to compensate for the adjusted each of the plurality of airflow values by adjusting each of a plurality of airflow percentage values.

In the computer readable medium, the sequences of instructions may further include instructions that will cause the processor to determine a set of factors for the plurality of airflow percentage values, the set of factors reduce a difference between the plurality of measured inlet and exhaust air temperature values and the second subset of the plurality of inlet and exhaust air temperature values. The sequences of instructions may also include instructions that will cause the processor to receive historically measured inlet and exhaust air temperature values and adjust the airflow percentage values by determining a set of factors, the set of factors reduces a difference between the historically measured inlet and exhaust air temperature values and the second subset of the plurality of inlet and exhaust air temperature values.

In the computer readable medium, the sequences of instructions may further include instructions that will cause the processor to determine a set of factors for the plurality of airflow values between the at least one cooling provider and each of the plurality of the equipment racks. The set of factors reduces a difference between the plurality of measured inlet and exhaust air temperature values and the second subset of the plurality of inlet and exhaust air temperature values in the cooling model. The sequences of instructions may also include instructions that will cause the processor to receive historically measured inlet and exhaust air temperature values. The sequences of instructions may further include instructions that will cause the processor to determine a set of factors for the plurality of airflow percentage values by reducing a difference between the historically measured inlet and exhaust air temperature values and the second subset of the plurality of inlet and exhaust air temperature values.

In the computer readable medium, the sequences of instructions may further include instructions that will cause the processor to receive a plurality of measured airflow values for each of a plurality of perforated tiles and substitute a total rate of airflow provided by at least computer room air conditioner with a subset of the plurality of measured airflow values in the cooling model, where the cooling model further includes the total rate of airflow provided by the computer room air conditioner.

The sequences of instructions may also include instructions that will cause the processor to receive a plurality of measured airflow values for each of a plurality of perforated tiles, determine a plurality of estimated airflow values for each of the plurality of perforated tiles, calculate a ratio between the plurality of measured airflow and the plurality of estimated airflow values, and adjust a leakage factor until a difference between a subset of the plurality of measured airflow and a subset of the plurality of estimated airflow values reaches a threshold. In the computer readable medium, the sequences of instructions may further include instructions that will cause the processor to determine a damping parameter based on a confidence parameter and a uniformity parameter.

The sequences of instructions that include instructions that will cause the processor to establish different ambient temperature values for each of the plurality of equipment racks and the at least one cooling provider, may further include instructions that will cause the processor to determine whether the inlet and exhaust air temperature values of each of the equipment racks and the at least one cooling provider pass error checking as a result of adjusting the cooling model.

The sequences of instructions that include instructions that will cause the processor to adjust each of a plurality of airflow percentage values, may further include instructions that will cause the processor to determine whether the inlet and exhaust air temperature values of each of the equipment racks and the at least one cooling provider pass error checking as a result of adjusting the cooling model.

The sequences of instructions that include instructions that will cause the processor to adjust each of the plurality of airflow percentage values by reducing the difference between the plurality of measured inlet and exit air temperature values and the second subset of the plurality of inlet and exit air temperature values, may further include instructions that will cause the processor to determine whether the inlet and exhaust air temperature values of each of the equipment racks and the at least one cooling provider pass error checking as a result of adjusting the plurality of airflow percentage values.

The sequences of instructions that include instructions that will cause the processor to adjust the airflow percentage values by reducing the difference between the historically measured inlet and exit air temperature values and the second subset of the plurality of inlet and exit air temperature values, may further include instructions that will cause the processor to determine whether the inlet and exit air temperature values of each of the equipment racks and the at least one cooling provider pass error checking as a result of adjusting the plurality of airflow percentage values.

The sequences of instructions include instructions that will cause the processor to adjust the third subset of the plurality of airflow values between the at least one cooling provider and each of the plurality of the equipment racks by reducing the difference between the plurality of measured inlet and exhaust air temperature values and the second subset of the plurality of inlet and exhaust air temperature values, may further include instructions that will cause the processor to determine whether the inlet and exit air temperature values of each of the equipment racks and the at least one cooling provider pass error checking as a result of adjusting the third subset of the plurality of airflow values.

The sequences of instructions include instructions that will cause the processor to receive historically measured inlet and exhaust air temperature values and adjust the airflow percentage values by reducing a difference between the historically measured inlet and exhaust air temperature values and the second subset of the plurality of inlet and exhaust air temperature values, may further include instructions that will cause the processor to determine whether the inlet and exit air temperature values of each of the equipment racks and the at least one cooling provider pass error checking as a result of adjusting the third subset of the plurality of airflow values.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings:

FIG. 9 is a graph comparing the results of at least one process in accordance with one example;

DETAILED DESCRIPTION

Figure 1:
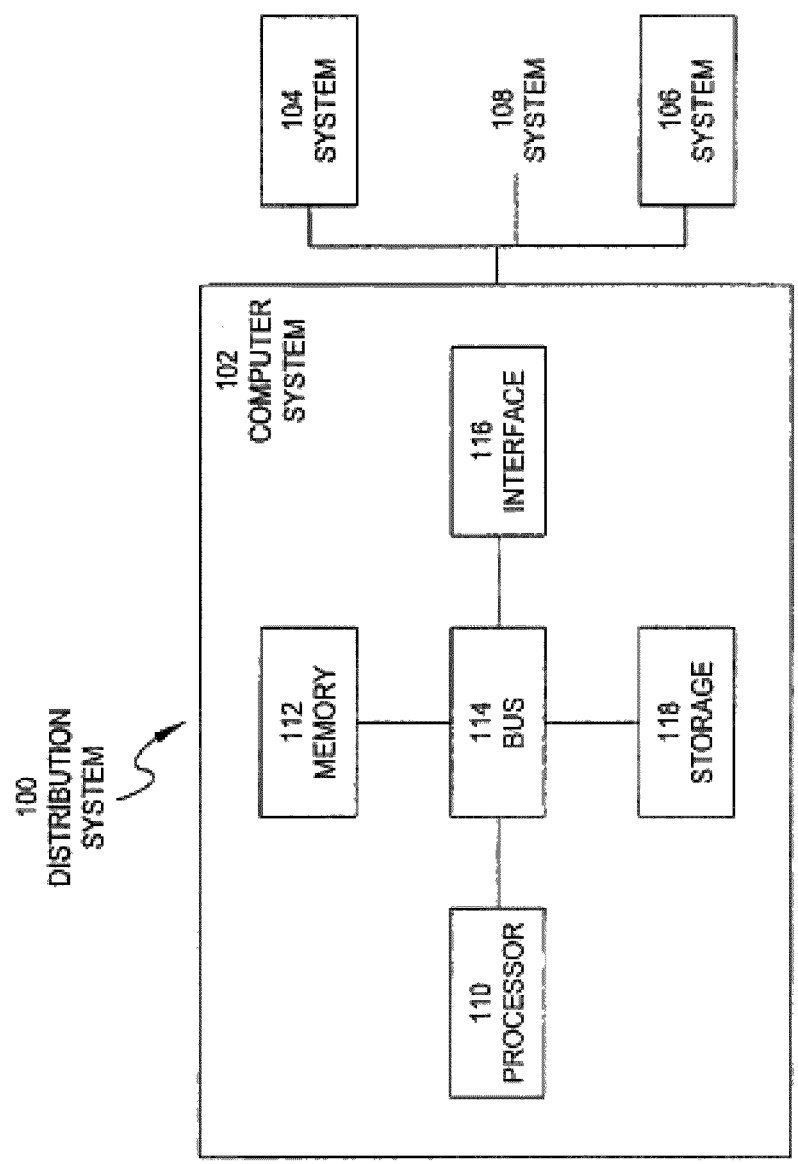
FIG. 1 is a block diagram of one example of a computer system with which various aspects in accord with the present invention may be implemented.

At least some embodiments in accordance with the present invention relate to systems and processes through which a user may design and analyze data center configurations. These systems and processes may facilitate this design and analysis activity by allowing the user to create models of data center configurations from which performance metrics may be determined. Both the systems and the user may employ these performance metrics to determine alternative data center configurations that meet various design objectives. Further, in at least one embodiment, a system incorporates measured temperature and airflow data into the predictive models of temperature measurement and airflow for a proposed layout of a data center equipment. In at least one embodiment, the system also incorporates measured temperature and airflow data into the predictive models of temperature measurement and airflow for an installed data center.

As described in U.S. patent application Ser. No. 12/019, 109, titled "System and Method for Evaluating Equipment Rack Cooling", filed Jan. 24, 2008 (referred to herein as "the '109 application"), and in U.S. patent application Ser. No. 11/342,300, titled "Methods and Systems for Managing Facility Power and Cooling" filed Jan. 27, 2006 (referred to herein as "the '300 application"), both of which are assigned to the assignee of the present application, and both of which are hereby incorporated herein by reference in their entirety, typical equipment racks in modern data centers draw cooling air into the front of the rack and exhaust air out of the rear of the rack. The equipment racks and in-row coolers are typically arranged in rows in an alternating front/back arrangement creating alternating hot and cool aisles in a data center with the front of each row of racks facing the cool aisle and the rear of each row of racks facing the hot aisle. Adjacent rows of equipment racks separated by a cool aisle may be referred to as a cool aisle cluster, and adjacent rows of equipment racks separated by a hot aisle may be referred to as a hot aisle cluster. Further, single rows of equipment may also be considered to form both a cold and a hot aisle cluster by themselves. A row of equipment racks may be part of multiple hot aisle clusters and multiple cool aisle clusters. In descriptions and claims herein, equipment in racks, or the racks themselves, may be referred to as cooling consumers, and in-row cooling units and/or computer room air conditioners (CRACs) may be referred to as cooling providers. In the referenced applications, tools are provided for analyzing the cooling performance of a cluster of racks in a data center. In these tools, multiple analyses may be performed on different layouts to attempt to optimize the cooling performance of the data center.

In at least one embodiment, a method is provided for performing, in real-time, an analysis on a layout of equipment in a data center for determining the maximum capacity of coolers in the layout. Based on the maximum capacity of the coolers, and other considerations discussed below, the analysis is performed for determining the maximum electrical load for equipment racks co-located with the coolers. The method may be incorporated in a system or a tool having capabilities for predicting the cooling performance of clusters and for performing other design and analysis functions of equipment in a data center. Further in at least some embodiments, methods and tools provide predictions of air temperatures at inlets and exhausts of equipments racks and cooling providers and the ambient temperature of a data center.

The aspects disclosed herein in accordance with the present embodiments, are not limited in their application to the details of construction and the arrangement of components set forth in the following description or illustrated in the drawings. These aspects are capable of assuming other embodiments and of being practiced or of being carried out in various ways. Examples of specific implementations are provided herein for illustrative purposes only and are not intended to be limiting. In particular, acts, elements and features discussed in connection with any one or more embodiments are not intended to be excluded from a similar role in any other embodiments.

For example, according to one embodiment of the present invention, a computer system is configured to perform any of the functions described herein, including but not limited to, configuring, modeling and presenting information regarding specific data center configurations. Further, computer systems in embodiments may be used to automatically measure environmental parameters in a data center, and control equipment, such as chillers or coolers to optimize performance. Moreover, the systems described herein may be configured to include or exclude any of the functions discussed herein. Thus, the embodiments are not limited to a specific function or set of functions. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items.

Computer System

Various aspects and functions described herein in accordance with the present embodiments may be implemented as hardware or software on one or more computer systems. There are many examples of computer systems currently in use. These examples include, among others, network appliances, personal computers, workstations, mainframes, networked clients, servers, media servers, application servers, database servers and web servers. Other examples of computer systems may include mobile computing devices, such as cellular phones and personal digital assistants, and network equipment, such as load balancers, routers and switches. Further, aspects in accordance with the present embodiments may be located on a single computer system or may be distributed among a plurality of computer systems connected to one or more communications networks.

For example, various aspects and functions may be distributed among one or more computer systems configured to provide a service to one or more client computers, or to perform an overall task as part of a distributed system. Additionally, aspects may be performed on a client-server or multi-tier system that includes components distributed among one or more server systems that perform various functions. Thus, the embodiments are not limited to executing on any particular system or group of systems. Further, aspects may be implemented in software, hardware or firmware, or any combination thereof. Thus, aspects in accordance with the present embodiments may be implemented within methods, acts, systems, system elements and components using a variety of hardware and software configurations, and the embodiments are not limited to any particular distributed architecture, network, or communication protocol.

FIG. 1 shows a block diagram of a distributed computer system 100, in which various aspects and functions in accord with the present embodiments may be practiced. Distributed computer system 100 may include one more computer systems. For example, as illustrated, distributed computer system 100 includes computer systems 102, 104 and 106. As shown, computer systems 102, 104 and 106 are interconnected by, and may exchange data through, communication network 108. Network 108 may include any communication network through which computer systems may exchange data. To exchange data using network 108, computer systems 102, 104 and 106 and network 108 may use various methods, protocols and standards, including, among others, token ring, Ethernet, wireless Ethernet, Bluetooth, TCP/IP, UDP, Http, FTP, SNMP, SMS, MMS, SS7, Json, Soap, and Corba. To ensure data transfer is secure, computer systems 102, 104 and 106 may transmit data via network 108 using a variety of security measures including TLS, SSL or VPN among other security techniques. While distributed computer system 100 illustrates three networked computer systems, distributed computer system 100 may include any number of computer systems and computing devices, networked using any medium and communication protocol.

Various aspects and functions in accordance with the present embodiments may be implemented as specialized hardware or software executing in one or more computer systems including computer system 102 shown in FIG. 1. As depicted, computer system 102 includes processor 110, memory 112, bus 114, interface 116 and storage 118. Processor 110 may perform a series of instructions that result in manipulated data. Processor 110 may be a commercially available processor such as an Intel Pentium, Motorola PowerPC, SGI MIPS, Sun UltraSPARC, or Hewlett-Packard PA-RISC processor, but may be any type of processor, multiprocessor, microprocessor or controller as many other processors and controllers are available. Processor 110 is connected to other system elements, including one or more memory devices 112, by bus 114.

Memory 112 may be used for storing programs and data during operation of computer system 102. Thus, memory 112 may be a relatively high performance, volatile, random access memory such as a dynamic random access memory (DRAM) or static memory (SRAM). However, memory 112 may include any device for storing data, such as a disk drive or other non-volatile, non-transitory, storage device. Various embodiments in accordance with the present invention may organize memory 112 into particularized and, in some cases, unique structures to perform the aspects and functions disclosed herein.

Components of computer system 102 may be coupled by an interconnection element such as bus 114. Bus 114 may include one or more physical busses, for example, busses between components that are integrated within a same machine, but may include any communication coupling between system elements including specialized or standard computing bus technologies such as IDE, SCSI, PCI and InfiniBand. Thus, bus 114 enables communications, for example, data and instructions, to be exchanged between system components of computer system 102.

Computer system 102 also includes one or more interface devices 116 such as input devices, output devices and combination input/output devices. Interface devices may receive input or provide output. More particularly, output devices may render information for external presentation. Input devices may accept information from external sources. Examples of interface devices include keyboards, mouse devices, trackballs, microphones, touch screens, printing devices, display screens, speakers, network interface cards, etc. Interface devices allow computer system 102 to exchange information and communicate with external entities, such as users and other systems.

Storage system 118 may include a computer readable and writeable, nonvolatile, non-transitory, storage medium in which instructions are stored that define a program to be executed by the processor. Storage system 118 also may include information that is recorded, on or in, the medium, and this information may be processed by the program. More specifically, the information may be stored in one or more data structures specifically configured to conserve storage space or increase data exchange performance. The instructions may be persistently stored as encoded signals, and the instructions may cause a processor to perform any of the functions described herein. The medium may, for example, be optical disk, magnetic disk or flash memory, among others. In operation, the processor or some other controller may cause data to be read from the nonvolatile recording medium into another memory, such as memory 112, that allows for faster access to the information by the processor than does the storage medium included in storage system 118. The memory may be located in storage system 118 or in memory 112, however, processor 110 may manipulate the data within the memory 112, and then may copy the data to the medium associated with storage system 118 after processing is completed. A variety of components may manage data movement between the medium and integrated circuit memory element and the presently described embodiments are not limited thereto. Further, the embodiments are not limited to a particular memory system or data storage system.

Although computer system 102 is shown by way of example as one type of computer system upon which various aspects and functions in accordance with the present embodiments may be practiced, any aspects of the presently disclosed embodiments are not limited to being implemented on the computer system as shown in FIG. 1. Various aspects and functions in accord with the presently disclosed embodiments may be practiced on one or more computers having a different architectures or components than that shown in FIG. 1. For instance, computer system 102 may include specially-programmed, special-purpose hardware, such as for example, an application-specific integrated circuit (ASIC) tailored to perform a particular operation disclosed herein. While another embodiment may perform the same function using several general-purpose computing devices running MAC OS System X with Motorola PowerPC processors and several specialized computing devices running proprietary hardware and operating systems.

Computer system 102 may be a computer system including an operating system that manages at least a portion of the hardware elements included in computer system 102. Usually, a processor or controller, such as processor 110, executes an operating system which may be, for example, a Windows-based operating system, such as, Windows NT, Windows 2000 (Windows ME), Windows XP or Windows Vista operating systems, available from the Microsoft Corporation, a MAC OS System X operating system available from Apple Computer, one of many Linux-based operating system distributions, for example, the Enterprise Linux operating system available from Red Hat Inc., a Solaris operating system available from Sun Microsystems, or a UNIX operating system available from various sources. Many other operating systems may be used, and embodiments are not limited to any particular implementation.

The processor and operating system together define a computer platform for which application programs in high-level programming languages may be written. These component applications may be executable, intermediate, for example, C-, bytecode or interpreted code which communicates over a communication network, for example, the Internet, using a communication protocol, for example, TCP/IP. Similarly, aspects in accord with the presently disclosed embodiments may be implemented using an object-oriented programming language, such as .Net, SmallTalk, Java, C++, Ada, or C# (C-Sharp). Other object-oriented programming languages may also be used. Alternatively, functional, scripting, or logical programming languages may be used.

Additionally, various aspects and functions in accordance with the presently disclosed embodiments may be implemented in a non-programmed environment, for example, documents created in HTML, XML or other format that, when viewed in a window of a browser program, render aspects of a graphical-user interface or perform other functions. Further, various embodiments in accord with the present invention may be implemented as programmed or non-programmed elements, or any combination thereof. For example, a web page may be implemented using HTML while a data object called from within the web page may be written in C++. Thus, the presently disclosed embodiments are not limited to a specific programming language and any suitable programming language could also be used.

A computer system included within an embodiment may perform additional functions outside the scope of the presently disclosed embodiments. For instance, aspects of the system may be implemented using an existing commercial product, such as, for example, Database Management Systems such as SQL Server available from Microsoft of Seattle Wash., Oracle Database from Oracle of Redwood Shores, Calif., and MySQL from MySQL AB, a subsidiary of Oracle or integration software such as Web Sphere middleware from IBM of Armonk, N.Y. However, a computer system running, for example, SQL Server may be able to support both aspects in accord with the presently disclosed embodiments and databases for sundry applications.

Example System Architecture

Figure 2:
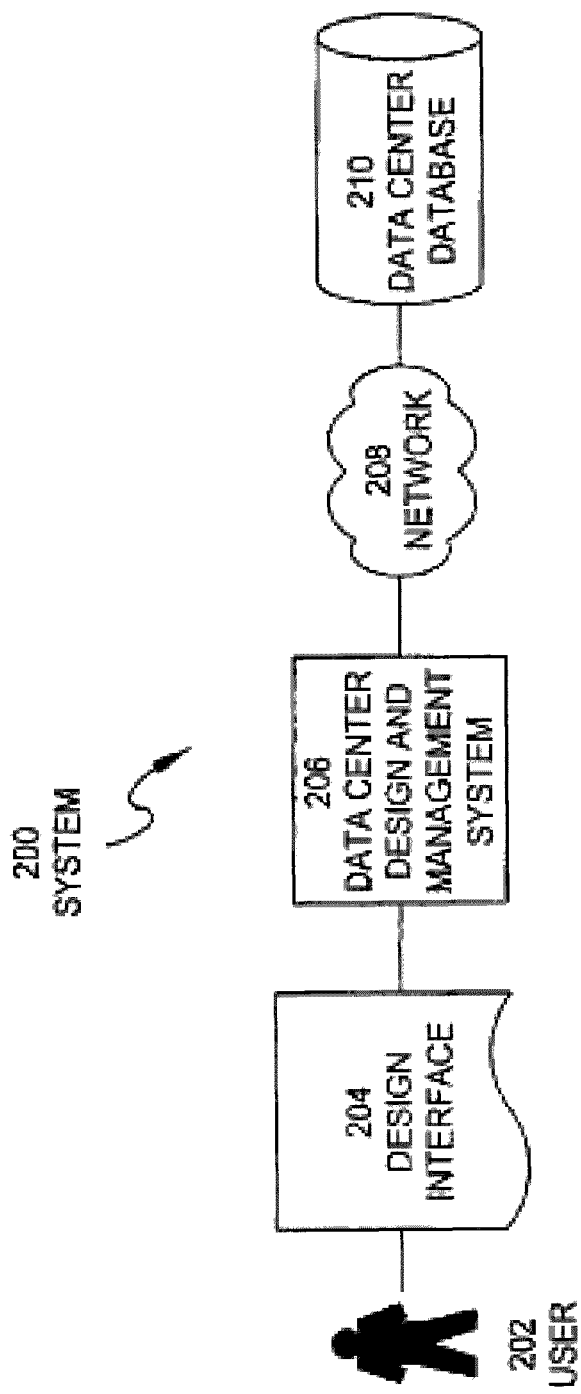
FIG. 2 a schematic of one example of a distributed system including a data center management system.

FIG. 2 presents a context diagram including physical and logical elements of distributed system 200. As shown, distributed system 200 is specially configured in accordance with the presently disclosed embodiments. The system structure and content recited with regard to FIG. 2 is for exemplary purposes only and is not intended to limit the embodiments to the specific structure shown in FIG. 2. As will be apparent to one of ordinary skill in the art, many variant system structures can be architected without deviating from the scope of the presently disclosed embodiments. The particular arrangement presented in FIG. 2 was chosen to promote clarity.

Information may flow between the elements, components and subsystems depicted in FIG. 2 using any technique. Such techniques include, for example, passing the information over the network via TCP/IP, passing the information between modules in memory and passing the information by writing to a file, database, or some other non-volatile storage device. Other techniques and protocols may be used without departing from the scope of the presently disclosed embodiments.

Referring to FIG. 2, system 200 includes user 202, interface 204, data center design and management system 206, communications network 208 and data center database 210. System 200 may allow user 202, such as a data center architect or other data center personnel, to interact with interface 204 to create or modify a model of one or more data center configurations. According to one embodiment, interface 204 may include aspects of the floor editor and the rack editor as disclosed in Patent Cooperation Treaty Application No. PCT/US08/63675, entitled METHODS AND SYSTEMS FOR MANAGING FACILITY POWER AND COOLING, filed on May 15, 2008, which is incorporated herein by reference in its entirety and is hereinafter referred to as PCT/US08/63675. In other embodiments, interface 204 may be implemented with specialized facilities that enable user 202 to design, in a drag and drop fashion, a model that includes a representation of the physical layout of a data center or any subset thereof. This layout may include representations of data center structural components as well as data center equipment. The features of interface 204, as may be found in various embodiments in accordance with the present invention, are discussed further below. In at least one embodiment, information regarding a data center is entered into system 200 through the interface, and assessments and recommendations for the data center are provided to the user. Further, in at least one embodiment, optimization processes may be performed to optimize cooling performance and energy usage of the data center.

As shown in FIG. 2, data center design and management system 206 presents data design interface 204 to user 202. According to one embodiment, data center design and management system 206 may include the data center design and management system as disclosed in PCT/US08/63675. In this embodiment, design interface 204 may incorporate functionality of the input module, the display module and the builder module included in PCT/US08/63675 and may use the database module to store and retrieve data.

As illustrated, data center design and management system 206 may exchange information with data center database 210 via network 208. This information may include any information needed to support the features and functions of data center design and management system 206. For example, in one embodiment, data center database 210 may include at least some portion of the data stored in the data center equipment database described in PCT/US08/63675. In another embodiment, this information may include any information needed to support interface 204, such as, among other data, the physical layout of one or more data center model configurations, the production and distribution characteristics of the cooling providers included in the model configurations, the consumption characteristics of the cooling consumers in the model configurations, and a listing of equipment racks and cooling providers to be included in a cluster.

In one embodiment, data center database 210 may store types of cooling providers, the amount of cool air provided by each type of cooling provider, and a temperature of cool air provided by the cooling provider. Thus, for example, data center database 210 includes records of a particular type of CRAC unit that is rated to deliver airflow at the rate of 5,600 cubic feet per minute (cfm) at a temperature of 68 degrees Fahrenheit. In addition, the data center database 210 may store one or more cooling metrics, such as inlet and outlet temperatures of the CRACs and inlet and exhaust temperatures of one or more equipment racks. The temperatures may be periodically measured and input into the system, or in other embodiments, the temperatures may be continuously monitored using devices coupled to the system 200.

Data center database 210 may take the form of any logical construction capable of storing information on a computer readable medium including, among other structures, flat files, indexed files, hierarchical databases, relational databases or object oriented databases. The data may be modeled using unique and foreign key relationships and indexes. The unique and foreign key relationships and indexes may be established between the various fields and tables to ensure both data integrity and data interchange performance.

The computer systems shown in FIG. 2, which include data center design and management system 206, network 208 and data center equipment database 210, each may include one or more computer systems. As discussed above with regard to FIG. 1, computer systems may have one or more processors or controllers, memory and interface devices. The particular configuration of system 200 depicted in FIG. 2 is used for illustration purposes only and embodiments of the invention may be practiced in other contexts. Thus, embodiments of the invention are not limited to a specific number of users or systems.

Measurement Aided Prediction Tool

In at least one embodiment, a tool is provided that incorporates temperature measurements into real-time cooling predictions. The tool also incorporates measured perforated tile airflow values into real-time predictions of perforated tile airflow of an under-floor plenum in a data center. The tool utilizes methods of modeling inlet and exhaust temperatures of each rack and cooler in a data center, as well as, a well-mixed ambient temperature of the data center. The tool incorporates into the model heated blocks and a raised-floor cooling system. The ability to incorporate measured data into predictive models allows the tool to improve the accuracy of temperature predictions of racks, including unmeasured racks in the existing data center scenarios, as well as, temperature predictions of coolers. The measured airflow rates of perforated tiles can improve the accuracy of airflow rate predictions at the unmeasured tiles, as well as, improve airflow rate predictions of plenum leakage. As discussed further below, the tool can incorporated in a data center design system, as a stand-alone tool, or as part of a data center management system.

Measured temperatures for racks or coolers can be obtained using sensors placed at fixed three-dimensional locations within the data center. Known specifics of the sensor locations allow for substitution of exact values from these sensors in the temperature estimates generated by any computational method, such as CFD, potential flow methods, as well as others. Additional smoothing and interpolation methods, for example, trilinear interpolation, may be used to incorporate the measured temperature values into the predictive models and to determine airflow values. Further, the smoothing and interpolation methods allow for convergence of predicted values to the more accurate airflow values as more temperature measurements are taken. The smoothing and interpolation methods could also be utilized with velocity sensors.

In the following description, seven high-level computational methods are provided that incorporate real-time temperature and airflow measurements into the predictive models described below. The computational methods rely on a real-time cooling model. Because there are typically limited direct ways to incorporate measured data into the predictive room temperature model, each method includes adjustment of the room temperature model to include the measured values. The seven high-level methods are identified as the Global Ambient Temperature Correction method, Local Ambient Temperature Correction method, Simple Airflow Partitioning Correction method, Trained Airflow Partitioning Correction method, Rack Airflow method, Tile Airflow Correction method and the Tile Airflow and Leakage Correction method. Each of these methods may be incorporated in a tool which can be combined with existing data center design and management systems to provide improved performance.

Updated Room Temperature Model

Figure 3:
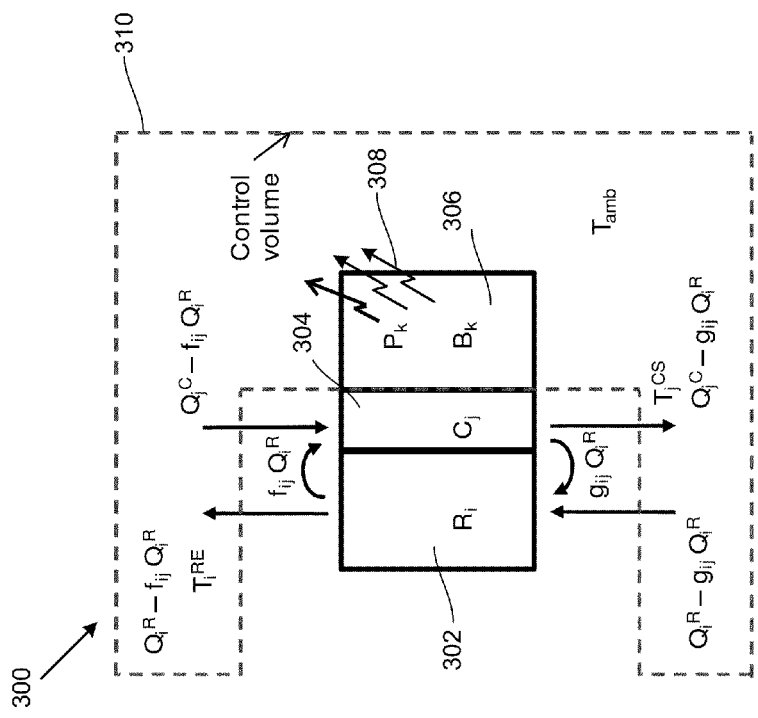
FIG. 3 is a schematic of an example of equipment in a data center that can be analyzed in accordance with at least one example.

In one embodiment, the predictive room temperature model involves a method for predicting the inlet and exhaust temperatures of each rack and cooler in a data center and the well-mixed ambient temperature, as disclosed in the patent application Ser. No. 12/795,862 (A2000-729019/BM-369), filed on Jun. 8, 2010, which is incorporated herein by reference in its entirety and is hereinafter referred to as the '862 application. In one embodiment, the room temperature model FIG. 3 shows a small data center 300 populated with one rack 302, one cooler 304, and one heated block 306 with power dissipation 308, which will be used to describe the predictive room temperature model. The room is considered to be perfectly sealed such that there is no heat transfer to the external surroundings. The heated block 306 (also identified in FIG. 3 as $B_k$) does not have an airflow value and has no specific temperature associated with it; but does add heat to the room which increases the ambient temperature. The dashed line 310 represents a control volume around the equipment. Airflow interactions between rack and cooler take place outside the control volume, while airflow interactions with the surrounding data center environment occur across the control volume boundaries.

Balancing the energy flow across the control volume boundaries and generalizing to any n racks and N cooling sources leads to Equation 3:

$$\sum_{i=1}^{n}\left(1-\sum_{j=1}^{N_c}f_{ij}\right)Q_i^R T_i^{RE} + \sum_{j=1}^{N}\left(Q_j^C - \sum_{i=1}^{n}g_{ij}Q_i^R\right)T_j^{CS} + \frac{1}{\rho c_p}\sum_{k=1}^{m}P_k + Q_l T_l = \sum_{j=1}^{N_c}\left(Q_j^C - \sum_{i=1}^{n}f_{ij}Q_i^R\right)T_{amb} + \sum_{i=1}^{n}\left(1-\sum_{j=1}^{N}g_{ij}\right)Q_i^R T_{amb} + Q_{CRAC}T_{amb} \quad (3)$$

as disclosed in the '862 application is updated to include heated blocks and a raised-floor cooling system, as discussed further below.

The room temperature model and the associated method rely on hot aisle and cold aisle capture indices disclosed in the '862 application and in the '009 application discussed above. As part of a hot aisle calculation, hot aisle CIs (HACIs) are computed from their constituent $f_{ij}$s which are defined as the fraction of airflow from rack i that is captured by cooling source j:

$$HACI_i = \sum_{j=1}^{N_c} f_{ij} \quad (1)$$

where $N_c$ is the number of local coolers and does not include perforated tiles.

In a similar manner, in cold aisle-CI calculations, cold aisle CIs (CACIs) can be computed from their constituent $g_{ij}$s which are defined as the fraction of airflow of rack i that originated from cooling source j:

$$CACI_i = \sum_{j=1}^{N} g_{ij} \quad (2)$$

where N is the number of local coolers and includes perforated tiles.

In summary, $f_{ij}$ and $g_{ij}$ are the fundamental building blocks of HACI and CACI respectively and they characterize the multiple airflow streams which combine to make-up a rack's inlet and exhaust airflow patterns. The room temperature model and the associated method of one embodiment uses the $f_{ij}$s and the $g_{ij}$s to determine relevant temperatures in a data center as will now be described.

where $Q_i^R$ and $Q_j^C$ are the airflow rates of rack i and cooler j respectively. $Q_l$ and $Q_{CRAC}$ are the total leakage and total CRAC airflow rates respectively. $T_i^{RE}$, $T_j^{CS}$, and $T_{amb}$ are the exhaust temperature of rack i, the supply temperature of cooler j, and the ambient data center room temperature. $P_k$ is power dissipated from the heated block $B_k$ and k is the total number of heated blocks. The product of the density and specific heat of air, $\rho c_p$, can be taken as a constant equal to approximately 1196 J/kg deg C.

The cooler supply temperature is a function of cooler capacity and its control algorithm; however, it can be written generally as a function of cooler return temperature and cooler airflow rate as shown in Equation 4:

$$T_j^{CS} = T_j^{CS}(T_j^{CR}, Q_j^C) \quad (4)$$

Cooler return temperature is the result of the mixing of streams which originate at rack exhausts or from the ambient as shown in Equation 5:

$$T_j^{CR} = \frac{\sum_{i=1}^{n} f_{ij} Q_i^R T_i^{RE}}{Q_j^C} + \left(1 - \frac{\sum_{i=1}^{n} f_{ij} Q_i^R}{Q_j^C}\right)T_{amb} \quad (5)$$

Rack inlet and exhaust temperatures are related by an assumed temperature rise $\Delta T_i^R$ across the rack as shown in Equation 6:

$$T_i^{RE} = T_i^{RI} + \Delta T_i^R \quad (6)$$

Rack inlet temperature is the result of the mixing of streams which originate at each cooler supply or from the ambient as shown in Equation 7:

$$T_i^{RI} = \sum_{j=1}^{N} g_{ij}T_j^{CS} + \left(1 - \sum_{j=1}^{N} g_{ij}\right)T_{amb} \qquad (7)$$

Equations 3-7 form a coupled set of 2N+2n+1 equations for 2N+2n+1 unknowns which, when solved, provide the inlet and exhaust temperatures of all racks, the return and supply temperatures of all coolers, and the ambient temperature.

When non-local CRACs are present, tile temperature may be considered identical to CRAC supply temperature. CRAC return temperature is equal to the computed $T_{amb}$ and the total cooling load can be computed in the same manner as that for local coolers, as shown in Equation 8:

$$P_{load} = \rho c_p Q_{CRAC} \Delta T_{CRAC} \qquad (8)$$

Figure 4:
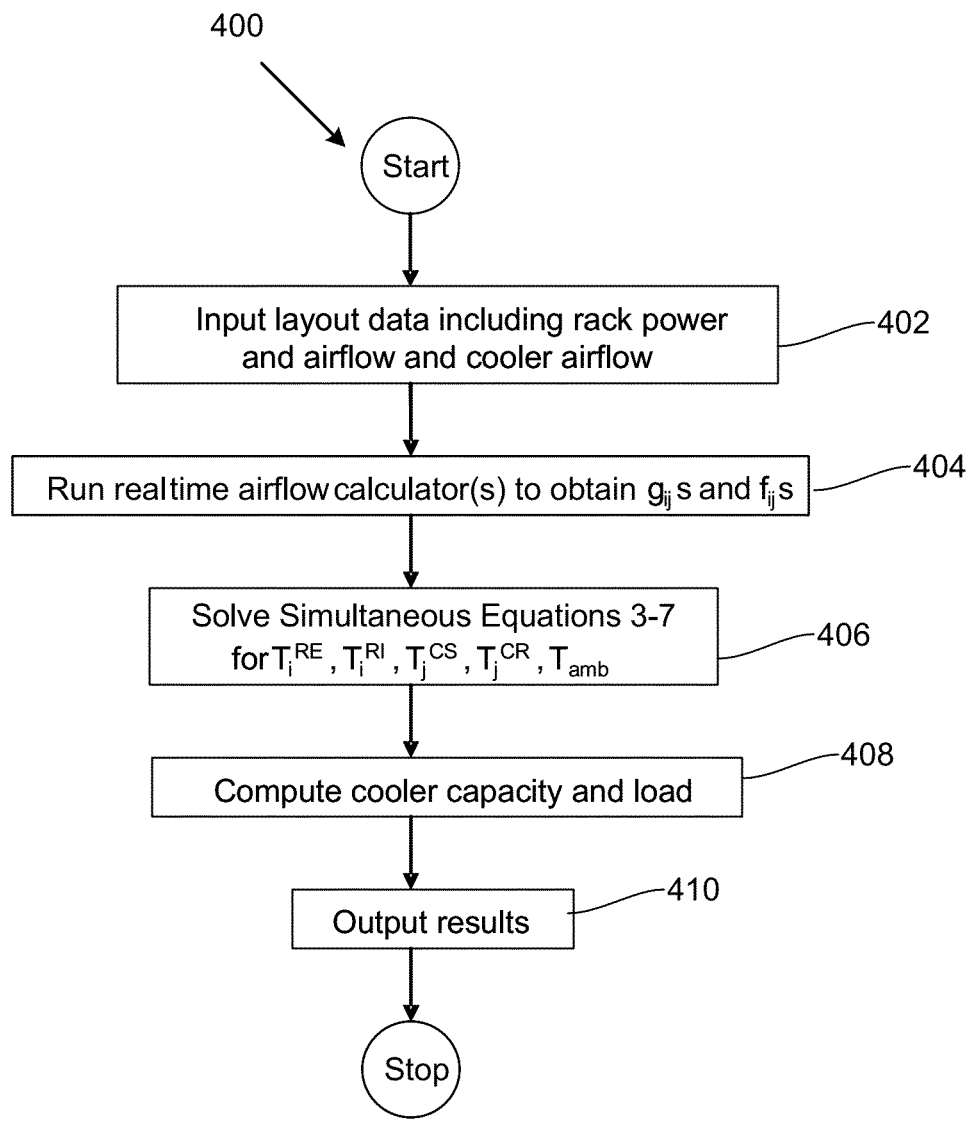
FIG. 4 is a flowchart of a process in accordance with one example.

The general process 400 for predicting data center airflows and temperatures is shown in FIG. 4. First at act 402, input data is entered either automatically or manually into the data center design or management software, as described above in reference to FIG. 2. Next at act 404, airflow patterns associated with racks and coolers are determined using the real-time tools discussed above and in documents referenced above. Multiple algorithms may be called for a complete data center analysis (e.g. different algorithms for hot and cold aisle two-row clusters, single-row clusters, containment clusters, etc.) Next at act 406, Equations 3-7 are solved for all unknown rack, cooler, and ambient temperatures. If desired, at act 408, the maximum cooler capacity and load at the predicted conditions may be computed for each cooler and provided to the user at act 410 along with all computed temperatures. The output temperatures and cooler capacities and loads may be displayed on a user display as described above.

In some embodiments, Equations 3-7 are linear except Equation 4 which depends on the cooler characteristics. In most practical cases, Equation 4 is piecewise linear in that, below some threshold return temperature, the cooler is able to supply air at a fixed set point-temperature. Above the threshold, the supply temperature tends to rise linearly with return temperature. This prevents a direct simultaneous solution to Equations 3-7 with a linear solver; however, for at least some embodiments, it is sufficient to assume that the cooler supply temperature is equal to the known supply temperature and then simply check to see if the capacity has been exceeded based on the resulting temperatures. If the capacity has been exceeded, for example by exceeding a preset threshold, a warning may be presented to the user and changes may be made to the layout until there are no more cooling warnings.

Figure 5:
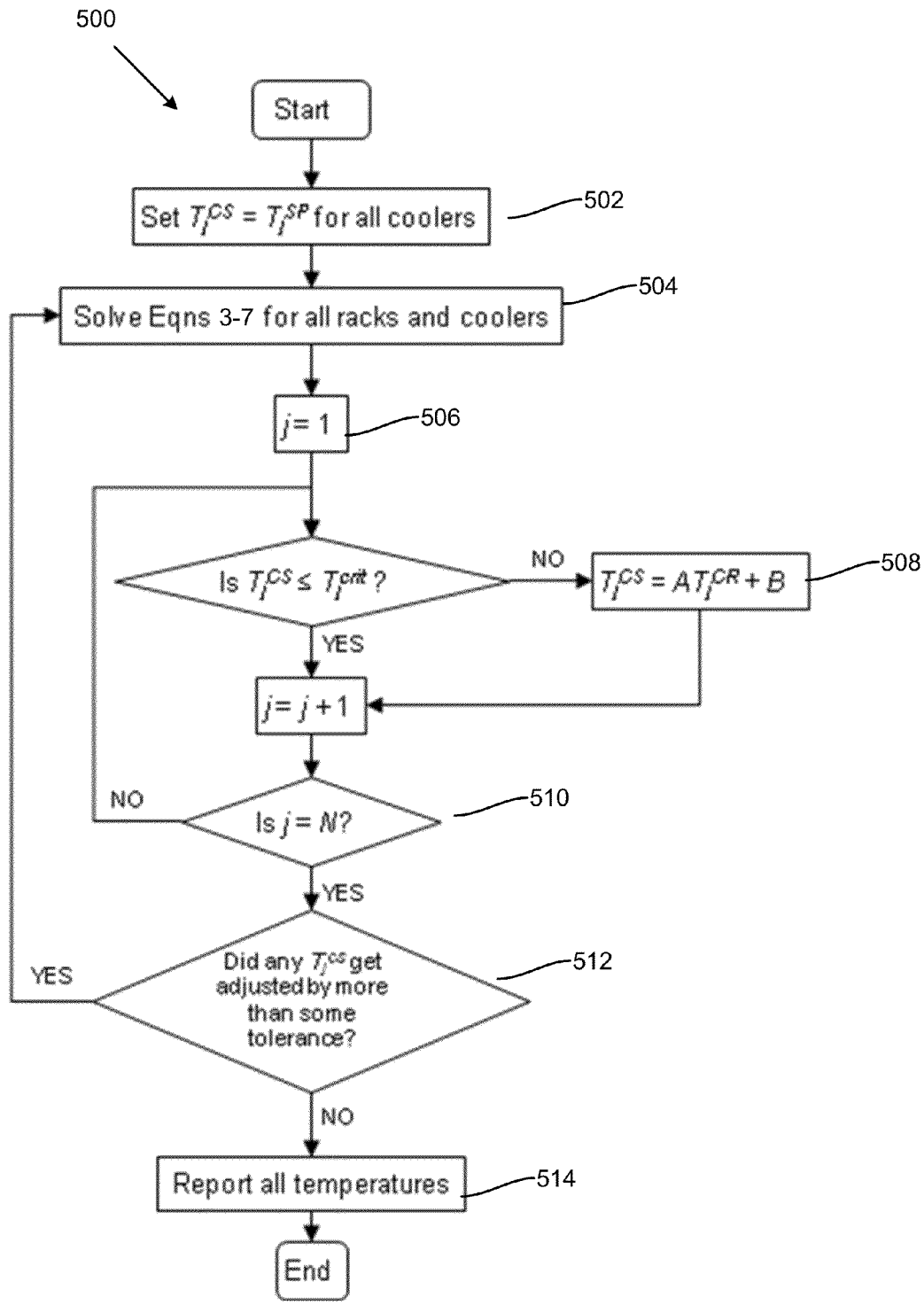
FIG. 5 is a flowchart of a process in accordance with one example.

An alternative process 500 for handling the non-linear cooler equation used in at least one embodiment will now be described with reference to FIG. 5. All temperatures are initially computed assuming that all coolers supply airflow at their set point temperature, and in the first act 502 of process 500, the supply temperature for each cooler is set equal to its set-point temperature. At act 504 of process 500, Equations 3-7 are solved for each cooler, and then in acts 506 through 510, for each cooler j for a total of N coolers, a check is made as to whether the computed return temperature is above or below the threshold temperature (above which the cooler can no longer maintain the set point supply temperature). The values of A and B in act 508 depend on the type of cooler and, in the case of chilled-water coolers, the Entering Water Temperature (EWT) and $\Delta T$ of the facility chilled water system. In any event, values of A and B may be readily estimated from published manufacturer data such as APC's "InRow RC Technical Data Manual," which is incorporated herein by reference in its entirety. If all return temperatures are below the threshold temperature, the assumed cooler set-point supply temperature is correct and no iteration is needed. If, instead, one or more coolers' threshold return temperatures have been exceeded, the supply temperatures are updated at act 508 based on Equation 4. At act 512, a determination is made as to whether any of the cooler supply temperatures were adjusted in acts 506 through 510 by more than a predetermined threshold, and if the outcome of act 512 is yes, then the entire set of Equations 3-7 is re-solved. This process continues until the supply temperatures of all coolers no longer changes from iteration to iteration by more than the set tolerance, and then all of the temperatures are reported at act 514. In one embodiment, the threshold used in act 512 is approximately 0.5 degrees Fahrenheit. In other embodiments the threshold is some small fraction of the difference between maximum and minimum temperatures anywhere in the data center. In yet another embodiment, the system may set and execute a fixed number of iterations. Although the cooler supply temperature is generally assumed to be a piecewise linear function of return temperature in the process of FIG. 4, this technique is not restricted to linear relationships.

Figure 6:
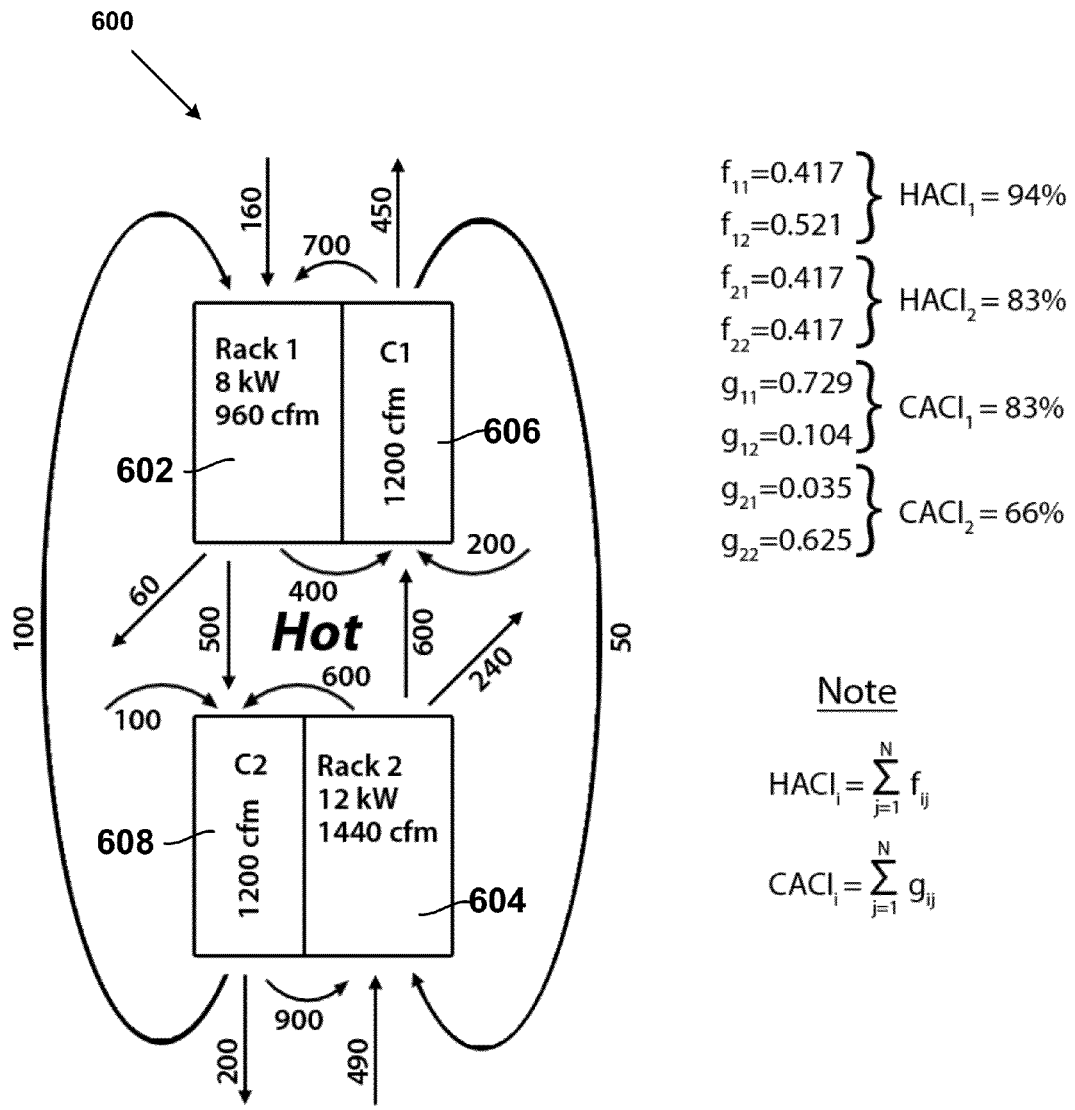
FIG. 6 is a diagram showing an example of a data center used in accordance with at least one example.

An example using the process of FIG. 4 will now be described using the equipment layout 600 shown in FIG. 6. The layout 600 includes two racks 602 and 604 (also identified in FIG. 6 as Rack 1 and Rack 2), and two coolers 606 and 608 (also identified in FIG. 6 as C1 and C2). The air flows for each of the coolers and racks are known and are identified in FIG. 6, and result in the $f_{ij}$ and $g_{ij}$ values listed. Also the calculated Hot Aisle Capture Index (HACI) for each cooler and Cold Aisle Capture Index (CACI) for each rack are also shown in FIG. 6. The cooler supply temperatures are known and equal to 68 degrees Fahrenheit. Also, from the indicated rack power and airflow rates, it is known that the temperature rise across each rack is approximately 26.5 degrees Fahrenheit. Equations 3-7 can be used to determine relevant temperatures for the layout 600.

The values from the example of FIG. 6 are substituted into Equation 3, resulting in one equation with three unknown values. Because the supply cooler temperatures are known, Equation 4 is not used in the present example. Equation 5 is applied to the example of FIG. 6, resulting in two equations for the return temperatures of each cooler. The application of Equation 6 results in two equations for the exhaust temperatures of the racks, and the application of Equation 7 results in two equations for the inlet temperatures of each of the racks.

Equations 3-7 applied to the example of FIG. 6 result in a coupled set of seven linear equations for the seven unknowns $T_1^{RE}, T_2^{RE}, T_{amb}, T_1^{RI}, T_2^{RI}, T_1^{CR}$, and $T_2^{CR}$. Although any of a variety of techniques can be used to solve the equations, in one embodiment, a linear Gaussian matrix solver is used resulting in the following temperature values:

$T_1^{RE}$=96.26° F.
$T_2^{RE}$=97.72° F.
$T_{amb}$=77.43° F.
$T_1^{RI}$=69.76° F.
$T_2^{RI}$=71.22° F.
$T_1^{CR}$=93.87° F.
$T_2^{CR}$=95.41° F.

In one embodiment, a number of checks can be performed to verify the solution. First, the system can verify that the total cooler load balances the total rack power, as it must in a sealed environment. Second, the system can verify that the temperature rise across each rack agrees with the initial assumption of approximately 26.5 degrees Fahrenheit (consistent with the defined airflow rate and power dissipation of each rack) by subtracting the rack inlet temperature from the rack exhaust temperature for each rack. For most practical cases, the application of Equations 3-7 leads to a set of coupled linear equations which can be solved directly (without iteration) to obtain all rack and cooler inlet and return temperatures as well as the room ambient temperature. The equations are rigorously conservative, assuring conservation of energy. Conservation of energy can be described as a balance between rack power and cooler load. The above described method can accurately predict rack inlet temperatures even when airflow is delivered to racks from multiple sources at different temperatures, e.g., row-based coolers and perforated tiles.

It is important to note that the room temperature model can be applied to airflow estimates generated by any computational method, such as CFD, potential flow, fast fluid dynamics, and algebraic calculators, as well as others. However, these computational methods typically may not allow a direct way of incorporating measured values. In one embodiment, predicting temperatures via computational airflow estimates $$\sum_{m=1}^{p} Q_m^{CRAC} \hat{T}_m^{CRAC} \quad (9)$$

where p is the total CRAC units;

$Q_m^{CRAC}$ is the (measured) known airflow rate for CRAC m; and $\hat{T}_m^{CRAC}$ is the measured return temperature for CRAC m.

In another embodiment, a combination of inlet and exhaust temperatures can be measured. The substitution of measured temperatures into Equations 3 or 5 completes the room temperature model adjustment for global ambient correction. Equations 3, 5, and 7 are modified to include measured inlet and exhaust temperatures and adjust the room temperature model to one described by Equation 10:

$$\sum_{i=1}^{n}\left(1 - \sum_{j=1, j \notin M}^{N_c} f_{ij}\right) Q_i^R T_i^{RE} + \sum_{j=1}^{N}\left(Q_j^C - \sum_{i=1, i \notin M}^{n} g_{ij} Q_i^R\right) T_j^{CS} + \frac{1}{c_p \rho} \sum_{k=1}^{m} P_k + Q_l T_l = \\ \sum_{j=1, j \notin M}^{N_c}\left(Q_j^C - \sum_{i=1}^{n} f_{ij} Q_i^R\right) T_{amb} + \sum_{i=1, i \notin M}^{n}\left(1 - \sum_{j=1}^{N} g_{ij}\right) Q_i^R T_{amb} + \\ \sum_{m=1, m \notin M}^{p} Q_m^{CRAC} T_{amb} + \sum_{j=1, j \in M}^{N_c} Q_j^C \hat{T}_j^{CR} + \sum_{i=1, i \in M}^{n} Q_i^R \hat{T}_i^{RI} + \sum_{m=1, m \in M}^{p} Q_m^{CRAC} \hat{T}_m^{CRAC} \quad (10)$$

can be combined with the room temperature model, described above. This combination can allow for incorporation of measured data from temperature sensors into these computational methods. The room temperature model, with its use of the general ambient temperature, and the methods detailed below, allow a more accurate solution by combining computational methods and measured data.

Global Ambient Correction Method

In one embodiment, the Global Ambient Correction (GAC) method corrects discrepancies between the room temperature model and measured temperatures by using a well-mixed ambient temperature. The previously described room temperature model assumes that all rack inlets receive their airflow from the adjacent coolers and from the well-mixed ambient air surrounding the racks. Instead, the GAC method assumes that all measured inlets (rack inlets and cooler returns) receive all of their airflow directly from the well-mixed ambient air. As a result, energy is extracted from the ambient air at the temperature measured for each rack. To balance for this adjustment, any airflow that was calculated in Equations 3-7 as being supplied directly to the inlet from the cooler in the algebraic model is now diverted to the well-mixed ambient. This adjustment results in a change to the well-mixed ambient temperature in the predictive room temperature model and affects the remaining rack inlets by improving the temperature predictions for the remaining racks.

In one embodiment, only the measured individual CRAC flow rates and return temperatures are incorporated in the room temperature model. The return temperatures for CRACs which are not measured are assumed to be the well-mixed $T_{amb}$. In this case, the last term in Equation 5, $Q_{CRAC} T_{amb}$ can be rewritten as shown in Equation 9:

where $\hat{T}_m^{CRAC}$ is the measured return temperature of the $m^{th}$ CRAC, $\hat{T}_j^{CR}$ is the measured return temperature of the $j^{th}$ local cooling unit, $\hat{T}_i^{RI}$ is the measured inlet temperature of the $i^{th}$ rack, and M is the set of measured objects.

The solution of the Equations 4, 5, 6, 7, and 10 provides the corrected temperatures for all unmeasured objects in the room. Including the measured temperatures will, in turn, improve the estimates for all other objects of interest, as described further below with regard to the illustrated example of FIG. 9.

In one embodiment, the GAC method assumes that not all the cooler return temperatures are measured and available to be substituted into Equation 10, otherwise the Equation becomes over-constrained and unsolvable. In the situation that all cooler return temperatures are measured, one or more of the measured cooler return temperatures should be left variable.

Figure 7:
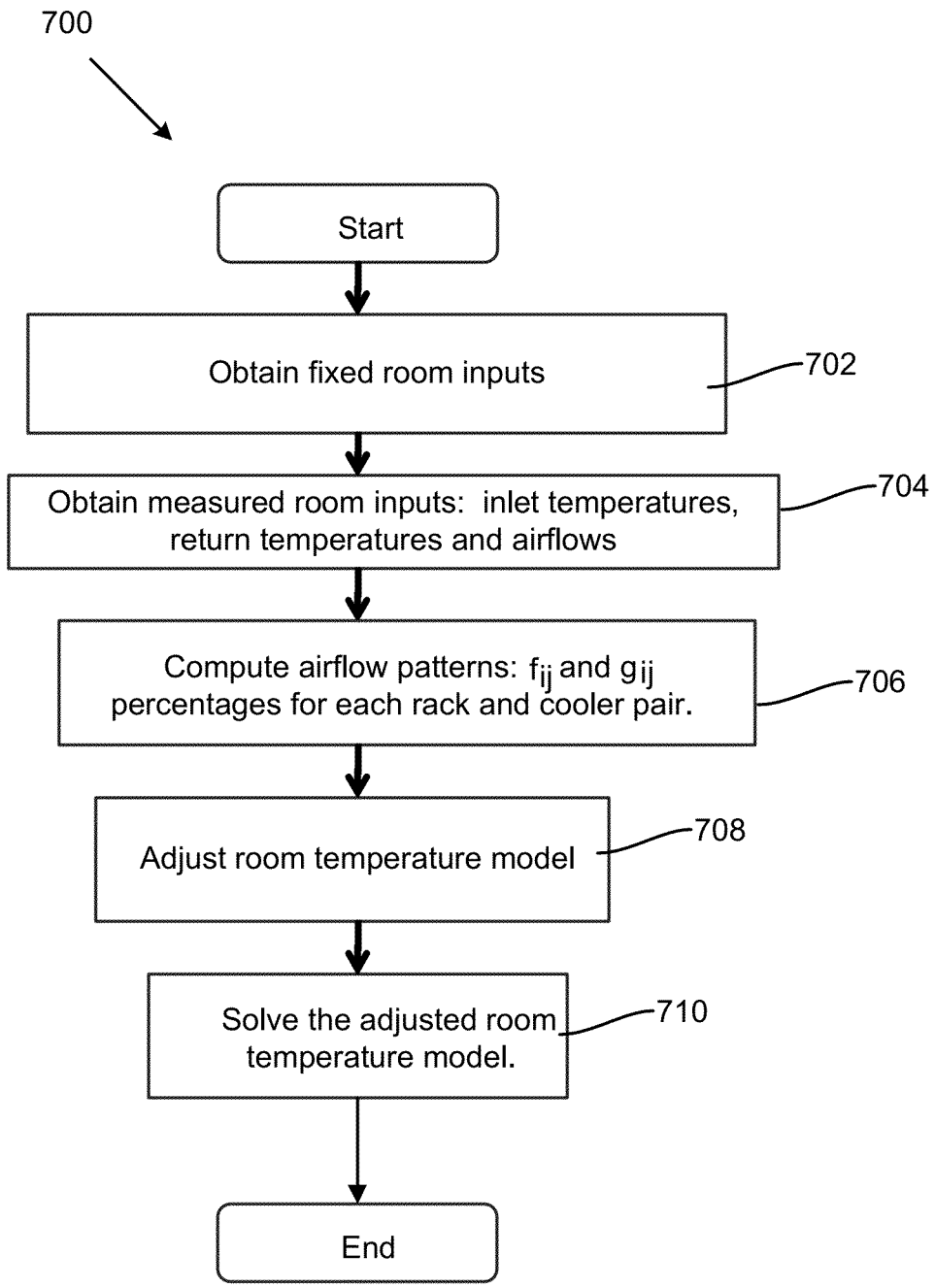
FIG. 7 is a flowchart of a process in accordance with one example.

The process 700 for the GAC method is shown in FIG. 7. First at act 702, fixed room inputs are obtained, such as, the rack powers, airflow for racks, coolers, tiles and CRACs, as well as, the cooler supply temperatures. Next at act 704, inlet temperatures, return temperatures, and airflows are obtained from the measured data at the respective racks, coolers and tiles. Next at act 706, airflow patterns $f_{ij}$ and $g_{ij}$ are determined for each rack and cooler pair as described above. At act 708, the room temperature model is adjusted using the measured temperatures and airflow rates. At act 710, the adjusted room temperature model is solved based on Equations 4, 5, 6, 7, and 10.

In one embodiment, the GAC method is used to perform a check on the measured values and to determine if the measured values are incorrect due to improper placement of sensors, improper values for room/object inputs, or other operational issues, e.g., boxes left in front of airflow objects. Because the GAC method is a real-time procedure and the method can easily adapt to measured temperatures given the original airflow and CI estimates, this routine can supplement any of the other correction methods described below to screen for incorrect inputs.

Figure 8:
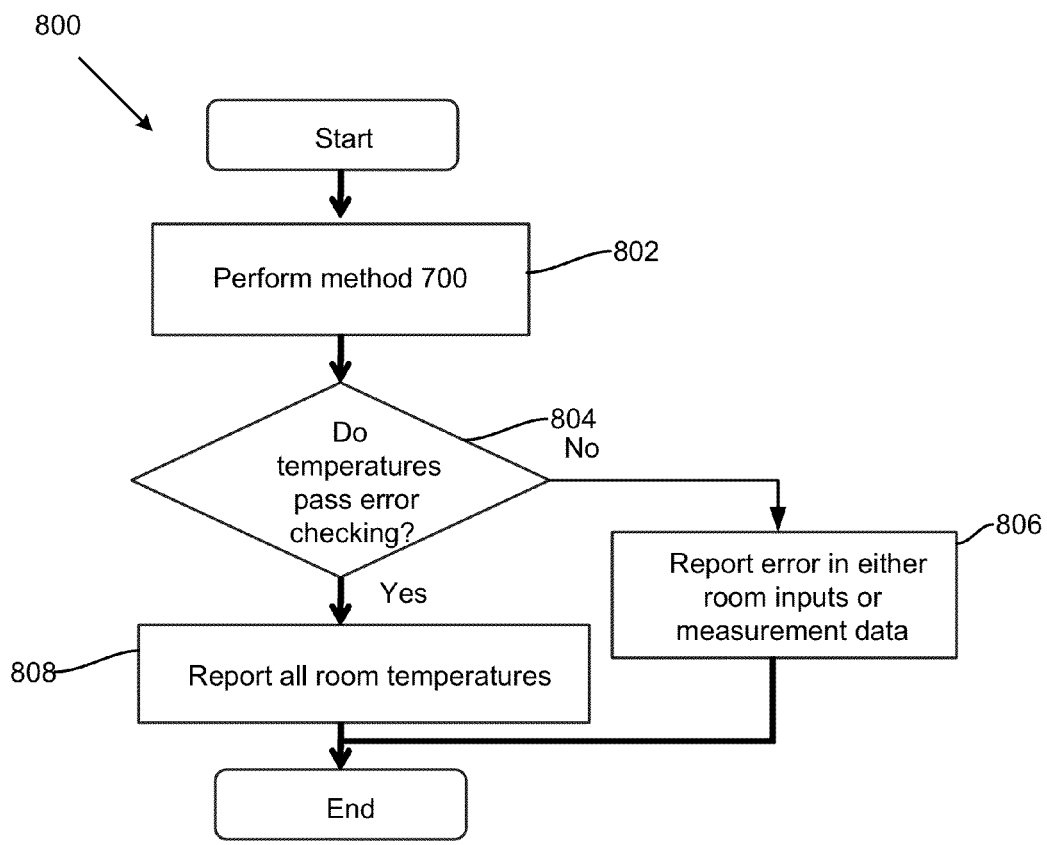
FIG. 8 is a flowchart of a process in accordance with one example.

The process 800 for performing error checking using the GAC method is shown in FIG. 8. First at act 802, the GAC method 700 is performed to solve the adjusted room temperature model using Equations 4, 5, 6, 7, and 10. At act 804, error checking is performed to determine if any of the room temperatures resulting from the adjusted room temperature model are inconsistent with room physics. If the room temperatures are inconsistent with room physics, then the temperatures do not pass error checking. If the temperature measurements pass error checking, at act 808, all room temperatures are reported. If the temperature measurements do not pass error checking, at act 806 the method 800 rejects the measured values and/or incorrect inputs and reports an error to measurements and/or the room inputs. Examples of temperatures that are inconsistent with principles of physics include: (1) the room ambient temp falling below the lowest cooler supply temperature (min $T_j^{CS} > T_{amb}$); (2) the room ambient temperature rising above the highest rack exhaust temperatures (max $T_i^{RE} < T_{amb}$); (3) the rack inlet temperatures falling below cooler supply temperatures (min $T_j^{CS} > T_i^{RI}$); or the cooler return temperatures rising above rack exhaust temperatures (max $T_i^{RE} > T_j^{CR}$).

Local Ambient Correction (LAC) Method

The predictive room temperature model of FIG. 3 and the method described with respect to FIG. 4 assume a single, well-mixed ambient temperature. In one embodiment, the Local Ambient Correction (LAC) method models each rack or cooler as ingesting ambient airflow at a temperature which may be unique to that piece of equipment. The LAC method may therefore determine a better approximation to real data center conditions.

Individual rack inlet and cooler return temperature measurements can be directly used to predict the local ambient room temperature for each measured rack or cooler. For each rack i, the local $T_{amb}^i$ can be calculated using Equation 7 modified as shown in Equation 11:

$$T_{amb}^i = \frac{\hat{T}_i^{RI} - \sum_{j=1}^{N} g_{ij} T_j^{CS}}{\left(1 - \sum_{j=1}^{N} g_{ij}\right)} \quad (11)$$

Similarly, the local $T_{amb}^j$ for each cooler j can be calculated using Equation 7 modified as shown in Equation 12:

$$T_{amb}^j = \frac{\hat{T}_j^{CR} - \sum_{i=1}^{n} f_{ij} Q_i^R T_i^{RE} / Q_j^C}{\left(1 - \sum_{i=1}^{n} f_{ij} Q_i^R / Q_j^C\right)} \quad (12)$$

The local ambient temperature for racks or coolers without sensors or instrumentation can be determined through other methods. For instance, the local ambient temperature of unmeasured racks or coolers may be determined by relying on an algebraic model to predict the local ambient temperature based on the layout of racks and coolers in a data center.

In one embodiment, the algebraic model first obtains the local ambient temperatures associated with nearby measured racks and coolers. The model then predicts the local ambient temperature of the unmeasured-rack/cooler based on its distance from other measured racks or coolers. In other embodiments, the algebraic model may take other factors into account such as equipment power, airflow, etc.

Much like other algebraic calculators, the LAC method involves a number of "constants" which can be tuned to maximize agreement with a number of CFD simulations or other data. Because the model depends on approximations of local ambient temperature for unmeasured racks or coolers, the local ambient method may be better suited in cases where more than half the racks in the layout of the data center are measured.

The LAC method then substitutes the respective global $T_{amb}$ terms of the room temperature model as represented by Equation 3 with the determined local $T_{amb}$ in Equations 11 and 12. The adjusted room temperature model can then be used to determine temperatures for other unmeasured equipment, for example, an estimate of return temperature for unmeasured CRACs.

The LAC method and the adjusted room temperature model can also be used to perform error checking, as described above with regard to FIG. 8. Similar to method 800, the room inputs and measured data are obtained. Then airflow patterns, $f_{ij}$ and $g_{ij}$ percentages for each rack and cooler pairs, are computed. The local ambient temperatures for each rack and cooler pair are obtained using Equations 11 & 12. The local ambient temperatures are substituted for the respective global ambient temperatures in Equation 3 and the adjusted room temperature is solved. Finally, the method determines if any of the predicted temperatures and/or the measured temperatures pass error checking. If the temperatures do not pass error checking the measured values and/or incorrect inputs are rejected and an error is reported.

FIG. 9 compares the temperatures predicted using the global and local ambient correction methods against actual measured temperatures. For this example, the "actual" data points are simulated via the CFD model, which was used to estimate the rack inlet temperatures in the room. The CFD estimates of the temperatures at two-thirds of the height of the inlet serve as our "measured" data points. A reading of approximately two-thirds to three quarters of the height of the inlet serves as a good estimate of the average measured temperature. The average temperature takes into consideration the skewed distribution of temperature on the equipment rack, with high temperatures occurring at the top of the equipment rack and low temperatures occurring close to the floor.

The resultant temperatures are presented in FIG. 9 according to the number of measured racks: graph 902 shows only predicted temperatures with no racks measured, graph 904 shows results with measured racks R2 and R9, graph 906 shows results with measured racks R1, R3, R8, and R10, and graph 908 shows results with measured racks R1, R3, R5, R6, R8, and R10. The configuration 902 compares actual rack inlet temperatures of each rack against predicted temperatures using the room temperature model and the method of FIGS. 3-4 without incorporation of rack measurements. The actual rack inlet temperatures are represented in FIG. 9 with circle data points and the predicted rack temperatures are represented in FIG. 9 with square data points.

Graphs 904-908 compare actual rack inlet temperatures of each rack with the estimates provided by the GAC method and the estimates provided by LAC method. The GAC predicted rack inlet temperatures are represented in FIG. 9 with triangle data points and the LAC predicted rack inlet temperatures are represented in FIG. 9 with square data points. The configurations 904-908 are also marked with measured inlet rack temperatures (represented in FIG. 9 with unfilled, square data points). Each configuration is marked according to the number of racks measured.

Graphs 904-908 show that both the GAC method and the LAC method more accurately predict temperatures for unmeasured racks as additional racks are measured. In configuration 904, with two measured racks, the GAC method predicts the actual rack inlet temperature for unmeasured racks more accurately than the LAC method. However, in configurations 906 and 908, when four or more racks are measured, the LAC method predicts rack inlet temperature for unmeasured racks more accurately than the GAC method.

Airflow Partitioning Correction Method

The Airflow Partitioning Correction (APC) method is another way of incorporating measured values into the room temperature model to correct discrepancies between predicted and measured rack and cooler temperatures. Inaccurate airflow estimates as input into the room temperature model, described above, may cause the room temperature model to predict incorrect temperatures. While the GAC and the LAC methods modify the room temperature model, in one embodiment, the Airflow Partitioning Correction (APC) method adjusts the fundamental airflow pattern predictions in the room temperature model. The old airflow patterns are corrected to provide good temperature predictions for unmeasured racks. In at least one embodiment, the APC method adjusts the predicted airflow values until the predicted temperatures for the room match the measured temperatures. According to some embodiments, the airflow patterns determined using the APC method are used within future configurations, alternative designs and control algorithms.

In the following description, two computational methods are provided that adjust the airflow estimates to more accurately predict room temperatures. The two methods are referred to as the Basic Airflow Partitioning Correction method and the Trained Airflow Partitioning Correction method. The Basic APC method uses currently available real-time room temperature measurements, while the Trained APC method uses current and previously obtained historical measurements. Storing and inputting historical measurements can help tune the room temperature model for even greater accuracy.

Basic Airflow Partitioning Correction Method

In one embodiment, the Basic APC method uses real-time detected measurements. In this embodiment, measured data is used to tune the hot aisle and cold aisle CIs for each rack (expressed in Equations 1 and 2) to achieve the desired temperatures by adjusting the airflow percentages $f_{ij}$ and $g_{ij}$ utilized within the room temperature model, expressed in Equation 3. The airflow percentages $f_{ij}$ and $g_{ij}$ are adjusted by multiplying $f_{ij}$ and $g_{ij}$ by a hot aisle factor $a_i$ and by a cold aisle factor $b_i$ for each rack i, respectively. Adjustments to the factors $a_i$ and $b_i$ create new airflow percentages $\tilde{f}_{ij}$ or $\tilde{g}_{ij}$ for each rack and cooler pair, (i,j), resulting in new temperature predictions in the room temperature model FIG. 3 and the method described in reference to FIG. 4. The APC method adjusts the factors $a_i$ and $b_i$ to find the sets of A and B, A={$a_1$, $a_2$, ..., $a_n$} and B={$b_1$, $b_2$, ..., $b_n$}, that cause the predicted temperatures to match the measured temperatures.

In another embodiment of the APC method, the method adjusts the factors $a_i$ and $b_i$ to find the allocation of sets A and B that minimizes the difference between the predicted and measured temperatures, as expressed by Equation 13:

$\min_{A,B} \Sigma_{k \in M} |R_{lk}|$, such that $\tilde{f}_{ij} = a_i f_{ij}$ for every i=1, 2, ..., n and j=1, 2, ..., $N_c$, $\tilde{g}_{ij} = b_i g_{ij}$ for every i=1, 2, ..., n and j=1, 2, ..., N (13)

where $R_k$ is the residual difference between measured and predicted temperatures for airflow object k. The Basic APC method can be computationally intensive and may utilize an optimization engine such as the Excel Solver, Matlab, or other similar tools.

Trained Airflow Partitioning Correction Method

In one embodiment, the Trained APC method uses historical temperature measurements to tune the room temperature model for greater accuracy in assessment, planning, and control. In many data centers, a wealth of measured data under different system configurations (IT loads) may be available. The airflow partitioning correction method can also utilize this data, learning from the past temperature measurements. The APC method determines airflow percentages ($f_{ij}$ and $g_{ij}$) and factors ($a_i$ and $b_i$) that reduce the residual error for all historical temperature measurements. The inclusion of these historic data points provides a more accurate correlation to the measured data. The trained APC method is expressed by Equation 14:

$$\min_{A,B} \sum_{l=1}^{d} \sum_{k \in M} |R_{lk}|, \text{ such that} \tag{14}$$

$\tilde{f}_{ij} = a_i f_{ij}$ for every $i = 1, 2, \ldots, n$ and $j = 1, 2, \ldots, N_c$, $\tilde{g}_{ij} = b_i g_{ij}$ for every $i = 1, 2, \ldots, n$ and $j = 1, 2, \ldots, N_c$, where $R_{lk}$ is the difference between the $k^{th}$ measured and predicted temperatures for the $l^{th}$ historical data point; and d is the number of historical data points.

The Trained APC method can be as computationally intensive as the Basic APC method. In one example, a solver is used to find optimal coefficients $a_i$ and $b_i$. In some embodiments, the Trained APC method can be performed offline, before the temperature predictions are needed. Addition of new historical data points can be performed at regular intervals to update the Trained APC method.

Figure 10:
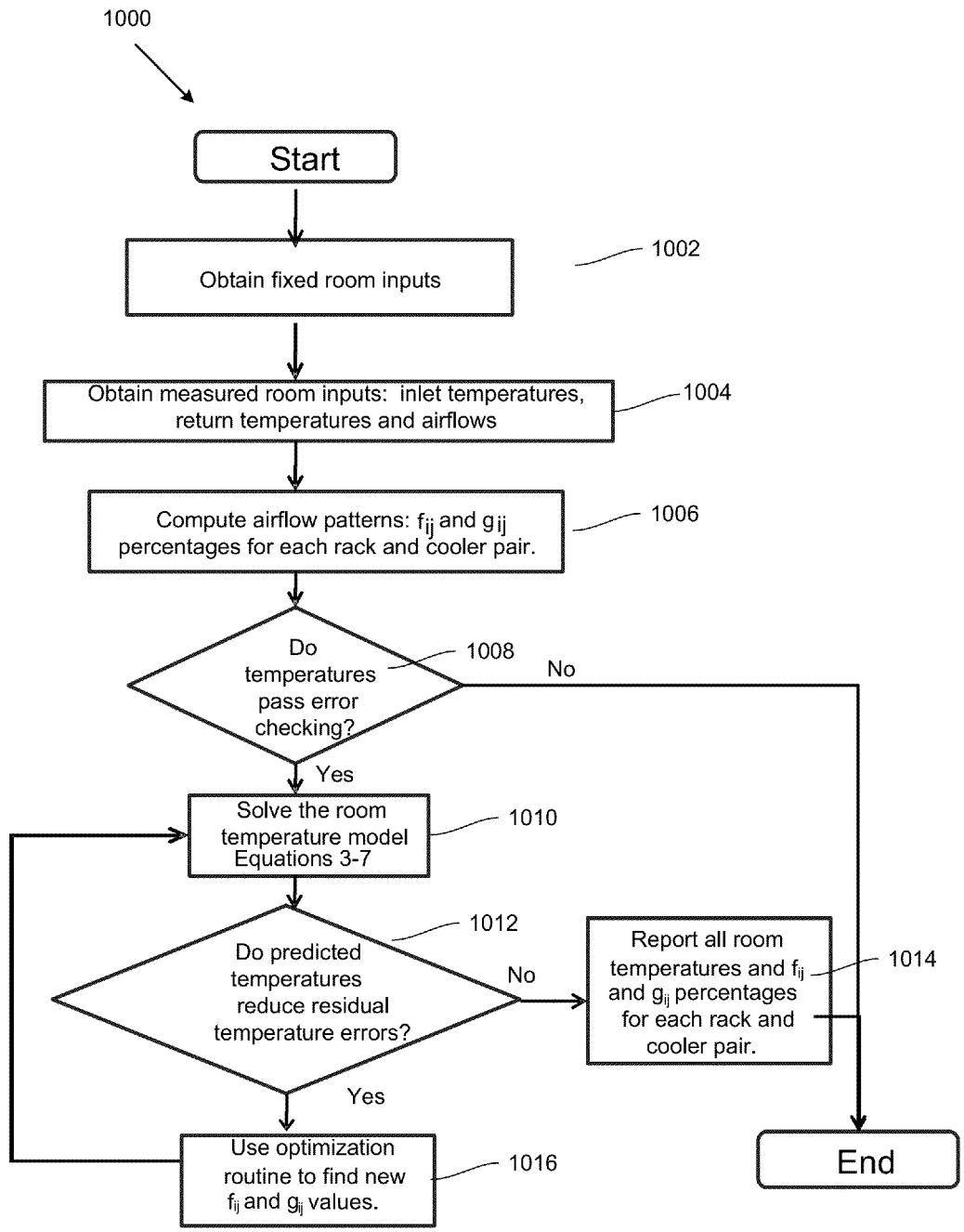
FIG. 10 is a flowchart of a process in accordance with one example.

The process 1000 for the APC method is shown in FIG. 10. The process 1000 is similar for both the Basic APC and the Trained APC methods. First at act 1002, fixed room inputs are obtained, such as, the rack powers, airflow for racks, coolers, tiles and CRACs, as well as, the cooler supply temperatures. Next at act 1004, inlet temperatures and airflows are obtained from the measured data at the respective racks, coolers and tiles. Next at act 1006, airflow patterns $f_{ij}$ and $g_{ij}$ are determined for each rack and cooler pair as described above. At act 1008, error checking is performed. If the temperature measurements and/or inputs pass error checking, at act 1010, Equations 3-7 are solved. If the temperature measurements do not pass error checking, the measured values and/or incorrect inputs are rejected and the process ends. At act 1012, the APC method determines whether the predicted temperatures reduce residual errors. For the Trained APC method the residual errors include many more data points than the Basic APC method. If the residual errors are reduced, at act 1016, an optimization routine or a solver is used to find new $f_{ij}$ and $g_{ij}$ values.

Rack Airflow Correction (RAC) Method

In one embodiment, the Rack Airflow Correction (RAC) method adjusts rack airflow values until the predicted measured temperatures are harmonized with measured temperatures. In many data centers, different system configurations (IT loads) may be available. The methods described above, assume that rack airflows are known for a specific IT load. However, the rack airflows may not be available to data center designers and managers and the estimations may contain considerable error. For example, a common assumption may be approximately 80-160 cfm/kW based on total rack load. Although the RAC method is more easily implemented with real-time cooling-prediction algorithms, it can also be used within CFD, PFM (Potential Flow Method) and other approaches.

For a rack with a fixed power, adjusting the rack airflow results in:

1. Changes to airflow partitioning estimates, $f_{ij}$ and $g_{ij}$, and
2. Changes in the temperature difference across the rack ($\Delta T_i$).

Similar to the APC method described above, the RAC method adjusts rack airflows by a set of factors $A = \{a_1, a_2, \ldots, a_n\}$ to reduce the difference between one or more historical data points. The RAC method is expressed by Equation 15:

$$\min_A \sum_{l=1}^{d} \sum_{k \in M} |R_{lk}|, \text{ such that} \quad (15)$$

$$\tilde{Q}_i^R = a_i Q_i^R \text{ for every } i = 1, 2, \ldots, n$$

where $R_{lk}$ is the difference between the $k^{th}$ measured and predicted temperatures for the $l^{th}$ historical data point; and d is the number of historical data points.

In one example, an optimization engine or a solver is used to find the coefficients in the RAC method. As stated above, the RAC method could potentially be utilized with many physics-based fluid dynamics solvers. However, the RAC method can be computationally expensive and may need substantial number of CFD solutions or other data sets to adjust one room temperature model.

Figure 11:
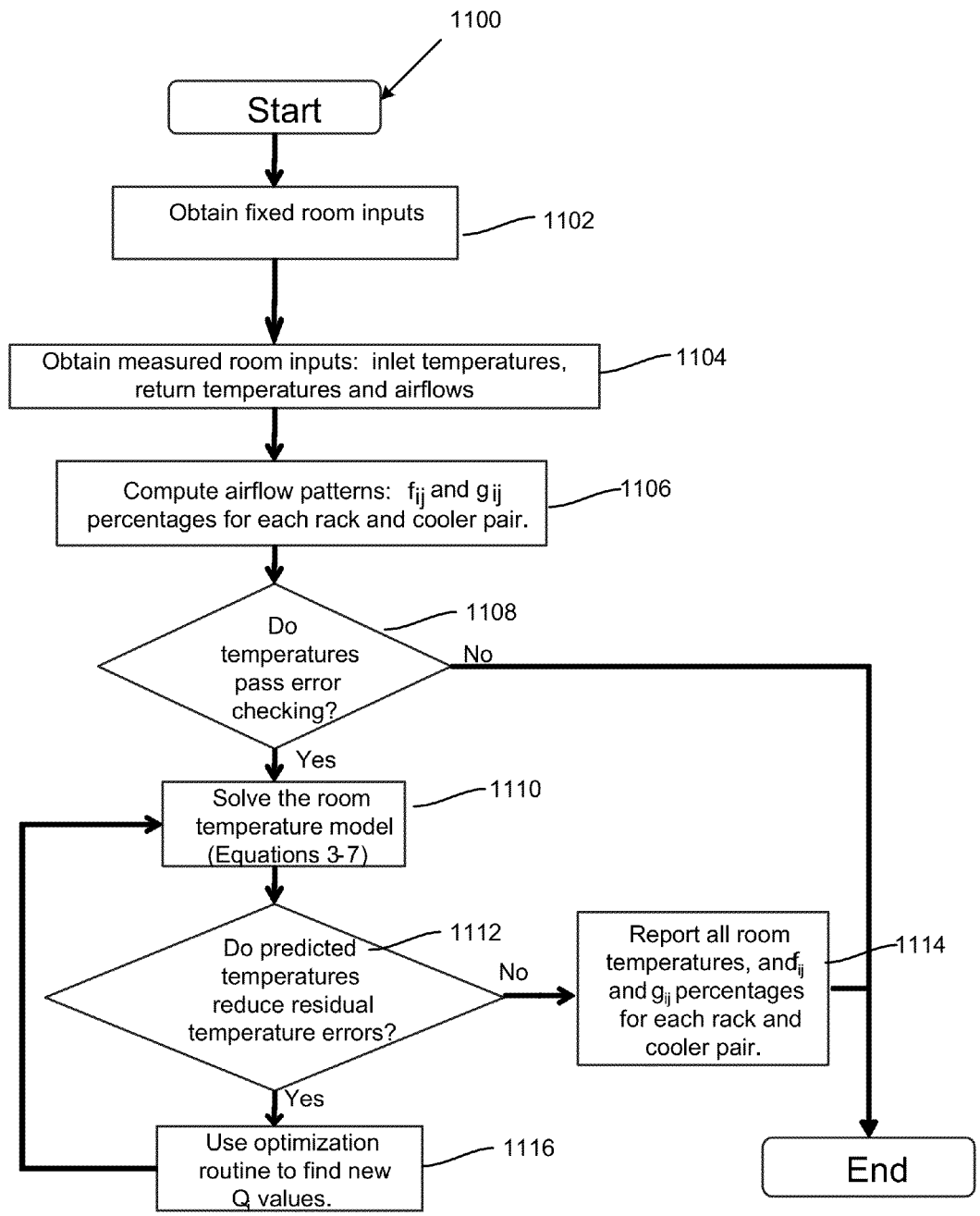
FIG. 11 is a flowchart of a process in accordance with one example.

The process 1100 for the RAC method is shown in FIG. 11. The process 1100 is similar to the APC method described in reference to FIG. 10. Acts 1102-1106 are the same as acts 1202-1206 in FIG. 10. At act 1108, error checking is performed. If the temperature measurements pass error checking, at act 1110, Equations 3-7 are solved. If the temperature measurements do not pass error checking, the measured values and/or incorrect inputs are rejected and the process ends. At act 1112, the RAC method determines whether the predicted temperatures reduce residual errors. If the residual errors are reduced, at act 1116, an optimization routine or a solver is used to find new $Q_i$ values.

Tile Airflow Correction Method

In some embodiments, the correction methods incorporating real-time temperatures and airflow measurements into the room temperature model, as described above, can be combined with a system and method of predicting perforated tile airflow rates, as disclosed in the patent application Ser. No. 12/884,832 (A2000-730319/BM-421), filed on Sep. 17, 2010 which is incorporated herein by reference in its entirety and is hereinafter referred to as the '832 application. For existing data centers, in one embodiment, actual airflow measurements from one or more perforated tiles can be used by a system to improve accuracy of one or more of the methods of predicting perforated tile airflow rates. In another embodiment, airflow measurements from one or more perforated tiles can be used by a system to improve the accuracy of the predicted temperature and airflow rates calculated using the correction methods, describe above. The measured airflow rates may further be used by the system, in one embodiment, as a check against calculated airflows. In data center management applications, actual perforated tile airflow values can be typically measured with a flow hood.

In one embodiment, measured tile airflow values can be directly incorporated in the real-time room temperature model by substituting the measured tile flow rates into the total rate of airflow, $Q_{CRAC}$, at a temperature of $T_t$ through the measured perforated tiles (Equations 3-7). In some embodiments, only a subset of the measured tile flow values can be incorporated into the room temperature model (Equations 3-7), otherwise the Equations become over-constrained and unsolvable. In one embodiment, all tile airflows can be incorporated if the total airflow equals the total CRAC airflow minus any leakage airflow. Using the measured tile airflow value to improve tile airflow predictions will directly improve the accuracy of the room-cooling prediction in a data center.

In some of the examples below, two common perforated tile types are considered: nominally 25%-open tiles and nominally 56%-open tiles. The more-restrictive (e.g. 25% open) tiles typically include drilled holes. The less restrictive, high-flow tiles (e.g. 56% open) may be similar to grates. However, other types of tiles may be used, as well as, combinations of different types of tiles.

Tile Airflow and Leakage Correction Method

In another embodiment, the measured airflow rates may be used by the system to accurately estimate the amount of leakage airflow, $Q_l$, that enters the data center. Because the sum of all tile airflows equals the CRAC airflow minus the leakage airflow, accurate predictions of leakage can be derived by accurately estimating the unmeasured tile airflow values, as described in any of the methods disclosed in the '832 application.

Similar to the local and global effects of the ambient air temperatures of racks in the data center, there are local and global effects of the airflow of tiles and CRACs in the data center. In one example, the relationship between tile airflow is maintained both on local (due to tile proximity) and global (due to total tile airflow constraints) levels. The local effects can be the result of tile types and airflow patterns. The global effects can be caused by the total amount of CRAC airflow and the amount of CRAC airflow that does not leave the plenum through the tiles, which is known as leakage.

In one example, the balance of airflow within the data center dictates that the amount of airflow through the tiles (measured and non-measured), equals the non-leakage CRAC airflow, expressed in Equation 16:

$$(1-f)Q^{CRAC} = \sum_{i \in M} \hat{Q}_i^{tile} + \sum_{i \notin M} Q_i^{tile} \quad (16)$$

where f is the percentage of leakage airflow (i.e. the leakage factor), $Q^{CRAC}$ is the total CRAC airflow, M is the set of measured tiles, $\hat{Q}_i^{tile}$ is the measured tile airflow of tile i, and $Q_i^{tile}$ is the predicted tile airflow of tile i.

If the accuracy of the tile airflow predictions is high, (using any of the methods described in the '832 application) then it is likely that the error in any prediction of total air flow is due to an inaccurate leakage estimate rather than solely a misinterpretation of the plenum airflow patterns. For example, a room with 10 tiles and 1000 cfm total airflow (assuming no leakage) can be expected to yield a flow of 100 cfm for each tile. If eight of the tiles were measured and each was found to have a flow of 80 cfm, the original uniformity of the tiles suggests that the leakage factor should be set close to 20% (as opposed to the alternative that holds the original leakage factor at 0% and sets the remaining two tiles with an average flow of 180 cfm).

In the following description, two computational methods are provided that change the estimated leakage factor based on tile airflow measurements. The degree of change to the leakage factor depends on the quantity and effectiveness of the measurements of tile airflows. For example, the leakage factor should not be significantly changed based on one or two measured tile airflows. In one example, the leakage factor can be adjusted if a user measures a large percentage of the tiles, which varies from case to case. For example, in some cases measuring ten percent of the tiles can be considered a large percentage. In another example, if the tile airflows are fairly uniform, the leakage factor can be adjusted after a small number of measurements, for example, symmetrical rooms with 25% open tiles. In rooms where the tile airflow distribution is uniform from tile to tile, any discrepancy between measured and predicted airflows at one tile should also be found at all other tiles. In another example, if the accuracy level of the original predictions is high, the leakage factor can be safely adjusted after taking a small number of measurements.

Leakage Factor Correction (LFC) Method

In one embodiment, the Leakage Factor Correction (LFC) method corrects leakage estimates by first determining an initial estimate of all the tile airflows, using any of the methods described in the '832 application. Second, a ratio is calculated comparing the total measured tile airflow to the total predicted tile airflow for the measured tiles. If the calculated ratio is greater than 1, meaning that more airflow is leaving through the measured tiles than initially predicted, the leakage factor value is reduced in the predictive models. If this ratio is less than the initial predictions (all other cases), the leakage factor value is increased in the predictive models.

The LFC method is described by Equation 17:

$$(1-\hat{f}) = \begin{cases} 1, & \text{if } (1-f)\frac{\sum_{i \in M} \hat{Q}_i^{tile}}{\sum_{i \in M} Q_i^{tile}} > 1 \\ (1-f)\frac{\sum_{i \in M} \hat{Q}_i^{tile}}{\sum_{i \in M} Q_i^{tile}} & \text{otherwise} \end{cases} \quad (17)$$

where $\hat{f}$ is the adjusted leakage factor.

Note that the $$\sum_{i \in M} \hat{Q}_i^{tile} \Big/ \sum_{i \in M} Q_i^{tile}$$

ratio dictates the direction and size of any change to the leakage factor.

The LFC method (and Equation 17) uses the measured tile airflow to quickly correct the leakage factor by reducing the difference between the initial estimate of the leakage factor value and the actual leakage factor value. According to some embodiments, the LFC method may be used in situations where the initial predictions of tile airflows (apart from the inaccurate initial leakage factor estimate) are accurate and the measured tiles are representative of the airflow. One example of such an embodiment is a small room with 25%-open tiles.

The Extended Leakage Factor Correction (ELFC) Method

In some configurations of a data center, a small sample size of the measured tile airflows can be misleading due to high variability in tile estimates. However, even in these configurations a large number of measurements can eventually provide an accurate leakage factor value. In one example, this high variability causes fluctuations to the leakage factor value, and produces inconsistent estimates of the tile airflow estimates. The LFC method may be unsuitable for these configurations.

To avoid high fluctuations to the leakage factor, the ELFC method can be used, in one embodiment, to provide an intermediate estimate. According to one embodiment, the intermediate estimate is a linear combination of the initial leakage estimate and a damped version of the corrected leakage factor (Equation 17). This intermediate estimate is mathematically expressed in terms of the damping parameter $\lambda$, described by Equation 18:

$$\lambda = c + (1-c)\left(\frac{|M|}{N^{tile}}\right)^{\alpha} \quad (18)$$

where c is the confidence in the initial airflow model, with $0 \leq c \leq 1$, $N^{tile}$ is the number of tiles, $|M|$ is the number of measured tiles, with $|M| \leq N^{tile}$, and $\alpha$ is a measure of the non-uniformity of tile airflows, with $\alpha > 0$.

In some examples, there can be numerous ways to define the damping parameter $\lambda$, but it should be a non-decreasing function of $|M|$ ($\lambda$ increases as more tiles are measured). In these examples, as $|M|$ increases towards $N^{tile}$, $\lambda$ should approach a final value of 1.

In the examples employing the ELFC method, as described by Equation 18, $\alpha$ is a problem-specific constant for the non-uniformity of tile airflows (mathematically, this corresponds to the marginal contribution of measured samples). In some examples, the highly uniform rooms featuring symmetry and 25% open tiles have a low $\alpha$ (for example between 0 and ½), while rooms with low plenum depths, asymmetry, and 56% open tiles will have a higher $\alpha$ (for example, greater than ½). High values of c and low values of $\alpha$, correspond to smaller number of measured tiles sufficient to accurately estimate leakage.

The values of c and $\alpha$ are dependent on properties of the layouts of the equipment in a room. Therefore, the values for c and $\alpha$ are selected on a room-by-room basis. In some examples, suggested values for two specific cases (25%-open tile rooms and all other rooms) are proposed. For rooms with large plenums and 25%-open tiles (c=0.9, $\alpha$=0) aggressive values are advised and for all other types of rooms (c=0.0, $\alpha$=1) are advised.

According to one embodiment, the intermediate estimate of the damping parameter $\lambda$, can be combined with Equation 17 to compute the corrected leakage factor:

$$(1 - \hat{f}) = \qquad (19)$$

$$\begin{cases} 1, & \text{if } (1-f)\left((1-\lambda) + \lambda \dfrac{\sum\limits_{i \in M} \hat{Q}_i^{tile}}{\sum\limits_{i \in M} Q_i^{tile}}\right) > 1 \\ (1-f)\left((1-\lambda) + \lambda \dfrac{\sum\limits_{i \in M} \hat{Q}_i^{tile}}{\sum\limits_{i \in M} Q_i^{tile}}\right), & \text{otherwise} \end{cases}$$

Note that when $\lambda=1$, the ELFC method (Equation 19) is the same as the LFC method (Equation 17). As described above, for data center configurations with only 25% open tiles, in some examples, the LFC method is better suited for calculating the leakage factor. In other examples, with data center configurations other than the small data center with 25% open tiles, the ELFC method is better suited for calculating the leakage factor. In these examples, the non-uniformity factor may be $\alpha \in [1,3]$ and the confidence factor may be $c \in [0,0.2]$.

Figure 12A:
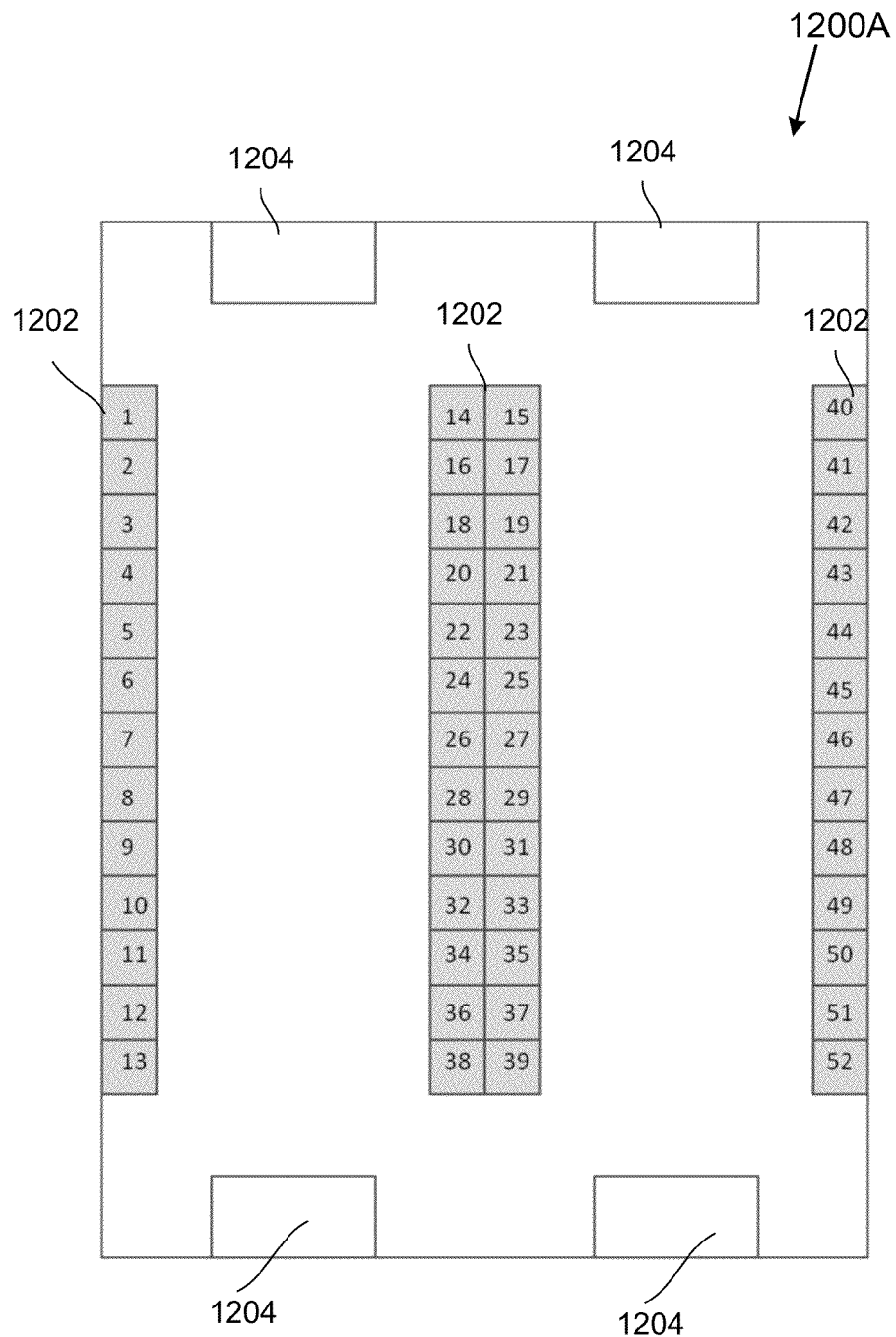
FIG. 12A is a schematic of one example of a data center that can be analyzed in accordance with at least one example.

An example illustrating the performance of the LFC and the ELFC methods described above will now be presented using the equipment layout 1200A shown in FIG. 12A. The layout 1200a includes 52 tiles 1202 and four CRAC units 1204. For this example, the total CRAC airflow rate is approximately 30,000 cfm and an actual leakage factor of 10% (corresponding to a total leakage airflow rate of 3000 cfm). However, all initial airflow predictions are made under the inaccurate assumption that the leakage factor is 30%. In this example, the initial predictions of the tile airflows are approximately 115 cfm lower than actual tile airflows.

Figure 12B:
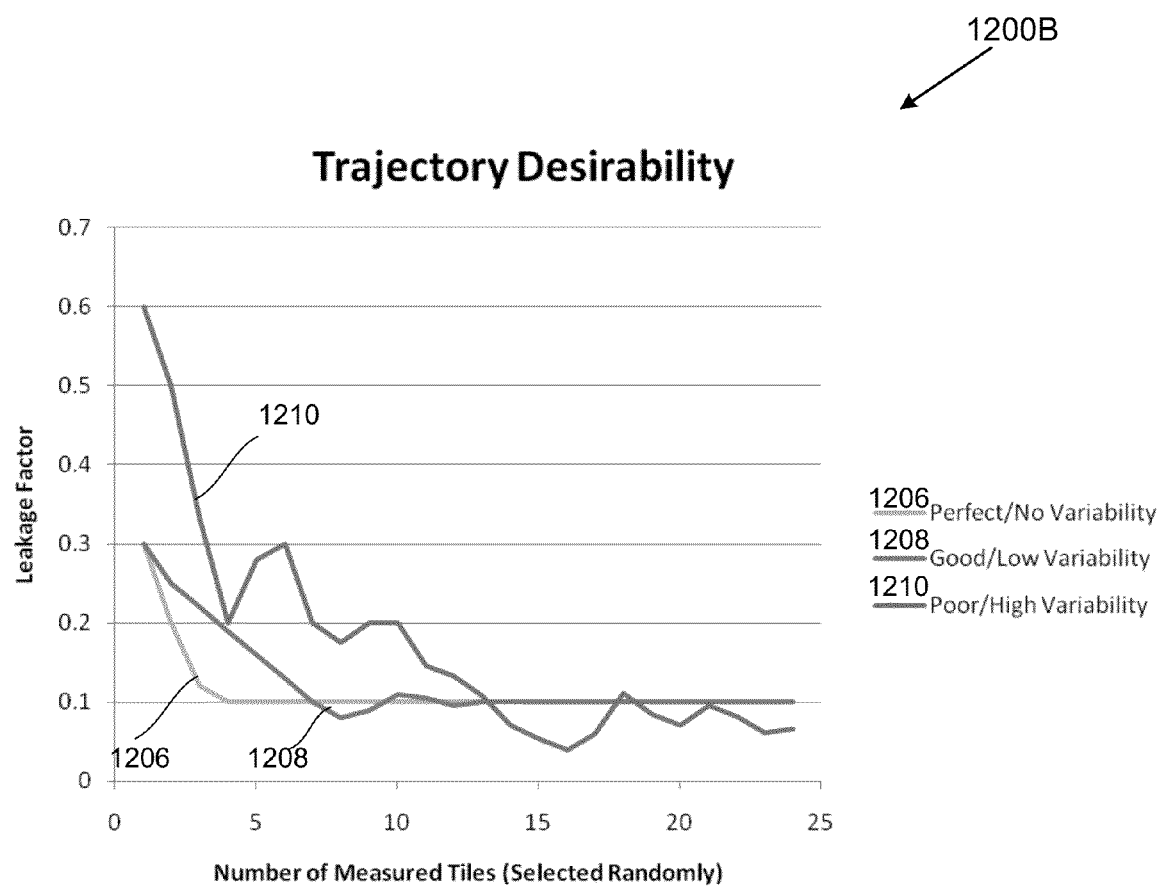
FIG. 12B is a bar graph comparing results of at least one process in accordance with one example.

FIG. 12B is a graphical representation 1200B of the correction of the leakage factor as the number of measured tiles increases in the equipment layout 1200A using the leakage correction methods as described above. FIG. 12B demonstrates some examples of the variability of the leakage factor versus the number of measured tiles. As shown in FIG. 12B, graph 1206 represents accurate tile airflow estimates with no variability, graph 1308 represents adequate tile airflow estimates with little variability, and graph 1210 represents inaccurate tile airflow estimates with high variability. As shown in FIG. 12B, accurately estimated tile airflow (no variability) 1206 results in the correction in the leakage factor with less than five measured tiles. Similarly, adequate tile airflow estimates with little variability 1208 results in the correction of the leakage factor with less than 15 measured tiles. Conversely, in the example of inaccurate tile airflow estimates with high variability, the leakage factor may not be properly corrected.

Figure 12C:
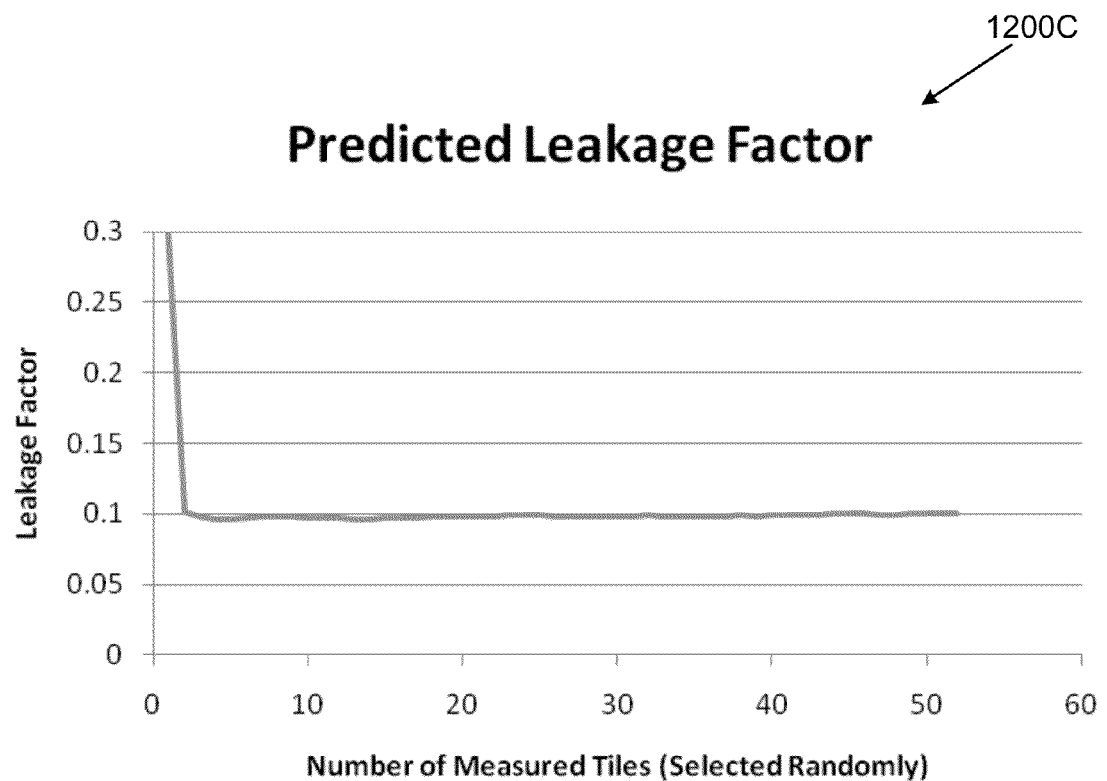
FIG. 12C is a bar graph comparing results of at least one process in accordance with one example.

According to some examples, the LFC method is optimally used in data center configurations that include 25% open tiles. FIG. 12C is a graphical representation 1200C of the corrected leakage factor as the number of measured tiles increases in the equipment layout 1200A. The result is determined in a data center with 25% open tiles and using the LFC method, as described above. For this example, the "predicted" data points are obtained by CFD from a room with 30% leakage and the "measured" data points are calculated from a room with 10% leakage. The method then selects tiles at random to "measure," and computes the new leakage factor value as described above with reference to Equation 17. When airflow estimates are computed in CFD with 30% leakage factor, the tile airflow initially ranges between approximately 388 cfm and 425 cfm. Steady differences between predictions and measured tile airflow, approximately 115 cfm for each tile, allows for prompt correction of the leakage factor with a small sample of five (or more) tiles.

Figure 12D:
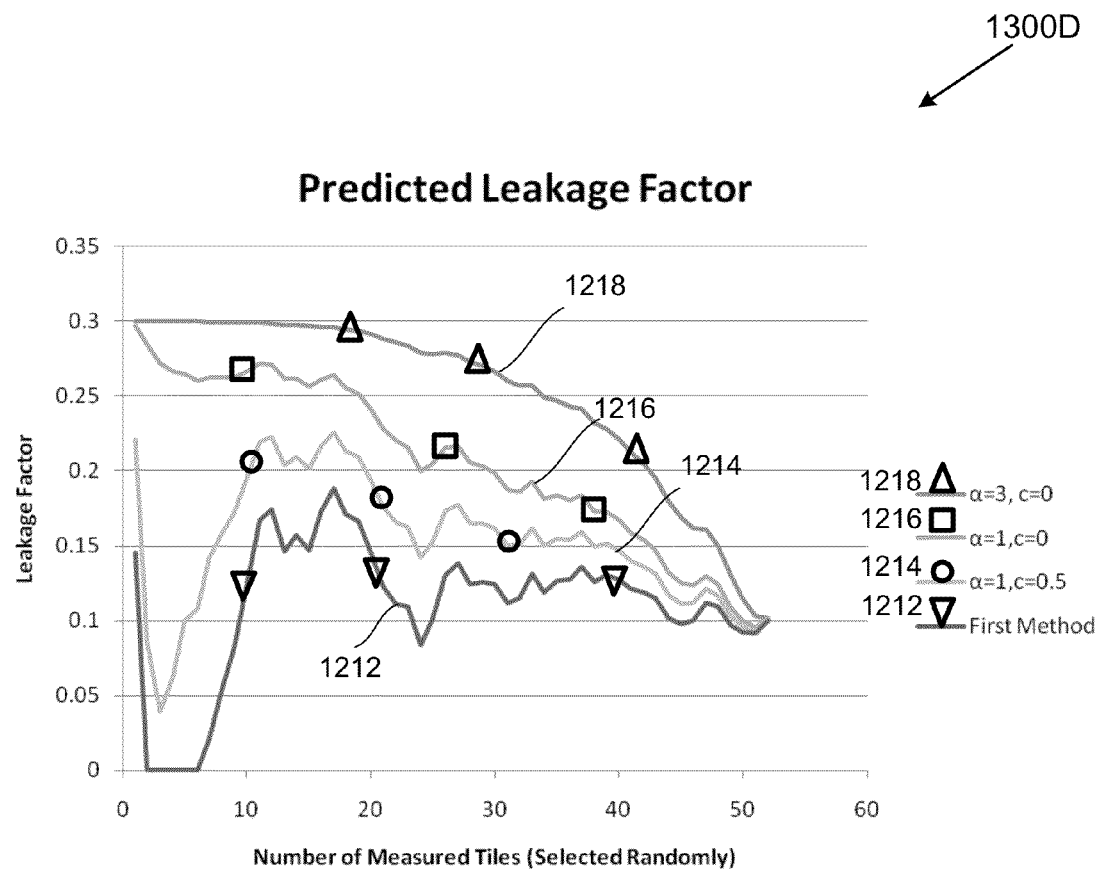
FIG. 12D is a bar graph comparing results of at least one process in accordance with one example.

According to another example, the ELFC method is used in data center configurations with 56% open tiles and where sampling five tiles or less results in high variability of the leakage factor value. FIG. 12D is a graphical representation 1200D of the leakage factor values as the number of measured tiles increases in the equipment layout 1200A, in a configuration with 56% open tiles. Graph 1200D shows the leakages factor determined using the LFC method along side the leakage factor determined using the ELFC method with various intermediate confidence and uniformity factors. As shown in FIG. 12D, graph 1212 represents the leakage factor value determined using the LFC method, graph 1314 represents the leakage factor value determined using the ELFC method where $\alpha=1$ and $c=0.5$, graph 1316 represents the leakage factor value determined using the ELFC method where $\alpha=1$ and $c=0$, and graph 1318 represents the leakage factor determined using the ELFC method where $\alpha=3$ and $c=0$.

In the example shown in FIG. 12D, graphs 1214-1218 highlight the versatility of the ELFC method, which allows for more gradual changes in the leakage factor determination. In this example, graph 1218 represents the most damped estimation of the leakage factor by remaining close to the initial leakage estimation until variability is diminished and true leakage factor is determined. However, graph 1218 represents a conservative result, reaching the actual leakage factor value after a large number of tiles are measured. In this example, graph 1216 shows less conservative correction of the leakage factor, reaching the actual leakage factor after a lower number of measured tiles with slight variability. Finally, graphs 1214 and 1212 show more aggressive correction of the leakage factor value, with high variability in response to measurements received from the first 30 measured tiles. In this configuration, graphs 1214 and 1212 present corrections that might be too variable to use these $\alpha$ and $c$ values, failing to center around the actual leakage factor.

Examples Comparing Predictive Methods

Figure 13:
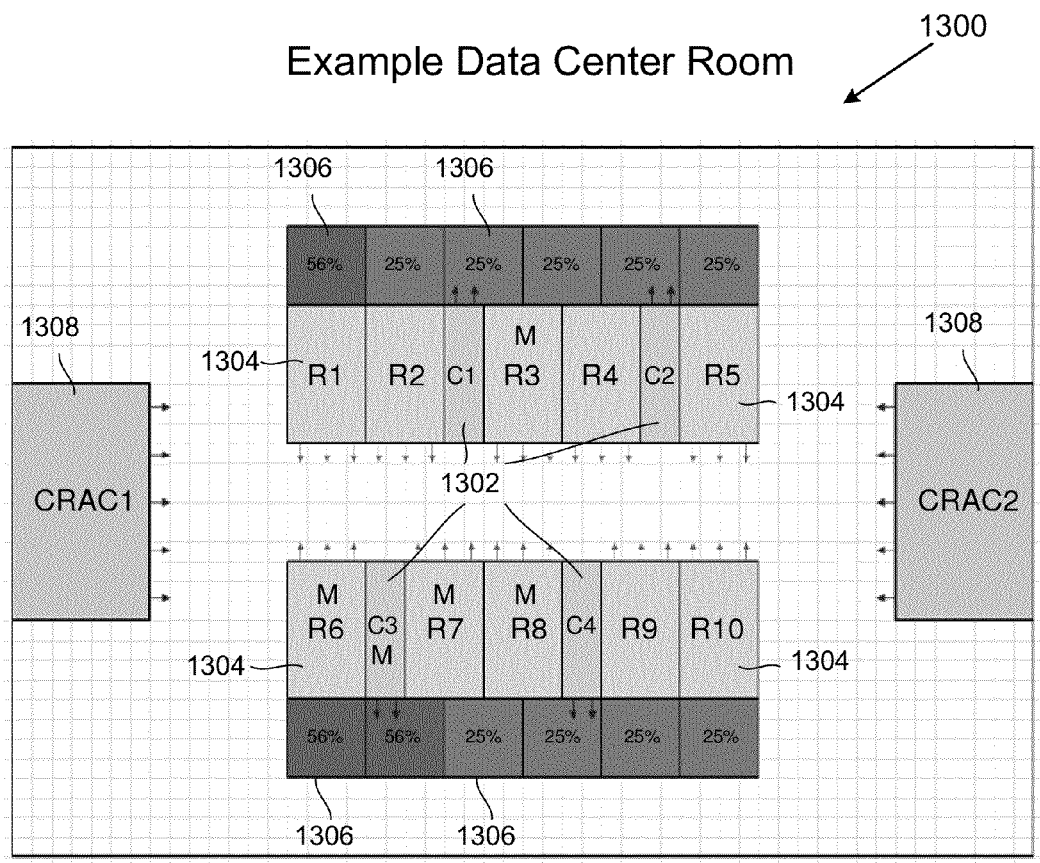
FIG. 13 is a schematic of one example of a data center that can be analyzed in accordance with at least one example.

An example illustrating the performance of the methods described above will now be described using the equipment layout 1300 shown in FIG. 13. The layout 1300 includes cooling units 1302 (shown in FIG. 13 as C1, C2, C3 and C4), racks units 1404 (shown in FIG. 13 as R1 to R10), tiles 1406 and CRACs 1308. The tiles 1406 are shown in FIG. 13 as either 25% open or 56% open. The measured racks and coolers are marked with "M." This equipment layout captures the benefits of measuring rack inlets, cooler returns, and tile airflows against a baseline of the predictive method and room temperature model described in reference to FIGS. 3 and 4.

Figure 14:
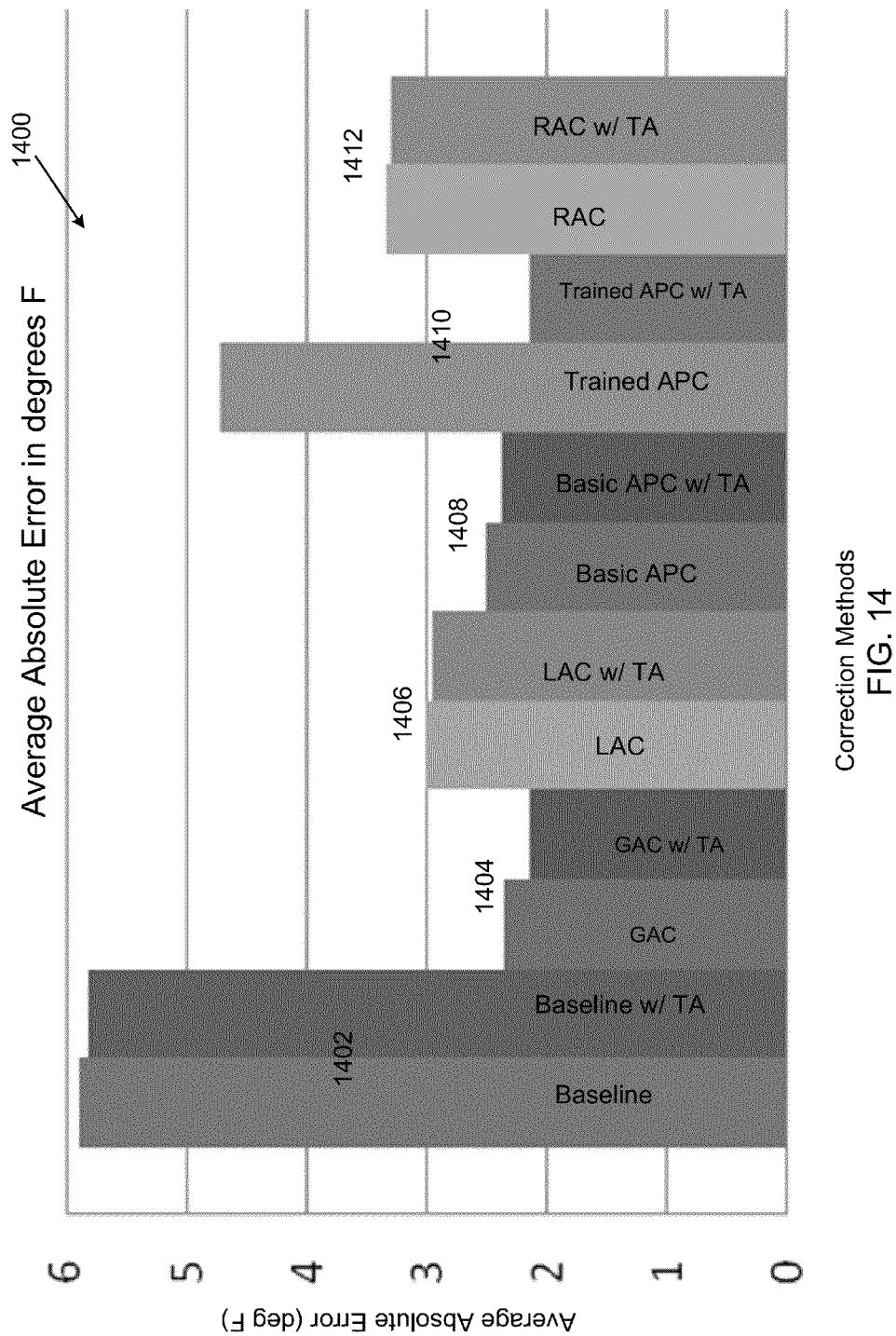
FIG. 14 is a bar graph comparing results of at least one process in accordance with one example.

FIG. 14 is a graphical representation 1400 of the average error achieved by including the measured values of the five airflow objects from the equipment layout 1400 with and without proper tile airflow estimates into the five corrective methods previously described. For this example, the correction models incorporated the measured inlet temperatures of the following airflow objects as shown in FIG. 13: racks R3, R6, R7, and R8, and C3. The height of the bar graphs in FIG. 14 represents the average absolute error of predictions measured in degrees Fahrenheit. The absolute error is the absolute value of the difference between the predicted temperature for an object and the temperature measured.

For this example, the "measured" data points are simulated via CFD, which was used to estimate the rack inlet and cooler return temperatures in the room. The CFD estimates of the temperatures at two-thirds of the height of the inlet serve as our "measured" data points. In addition, tile airflows were also "measured" via CFD to illustrate gains in accuracy when accurate tile airflows are used, instead of uniformly distributed tile airflows.

The graph 1400 shows the average absolute error for each correction method, with uniform tile airflow (no marking) and with tile airflow estimates (w/TA marking), starting from left to right: first the Baseline (no measurements taken) 1502, followed by GAC method 1404, followed next by LAC method 1406, followed next by Basic APC method 1408, then followed by Trained APC method 1410, and finally RAC method 1412. The Baseline 1402 represents the predictive method and room temperature model without incorporating measured room temperatures.

As shown in FIG. 14, the average absolute error for the Baseline predictive method and room temperature model 1502 is approximately six degrees Fahrenheit for each rack, cooler, and CRAC. In addition, the FIG. 14 shows that including measured data for five of the sixteen airflow objects, the absolute error can be reduced by approximately 50% when using ambient correction methods 1404 and 1406 or APC methods 1408-1410. The Trained APC 1410 with accurate tile airflow provides the lowest average error, performing slightly better than the GAC 1404 and Basic APC 1408. Although, the LAC 1406 has an absolute error slightly larger than GAC 1404 and Basic APC 1408 the LAC shows optimal performance when more than 40% of the airflow objects are measured, as described above in reference to FIG. 9. The performance of the RAC method 1412 is sufficiently accurate, reducing error by 45%. In this configuration, we note that incorrect tile airflows do not significantly alter the temperatures for most of the correction methods, but can strongly affect the Trained APC 1410.

Figure 15:
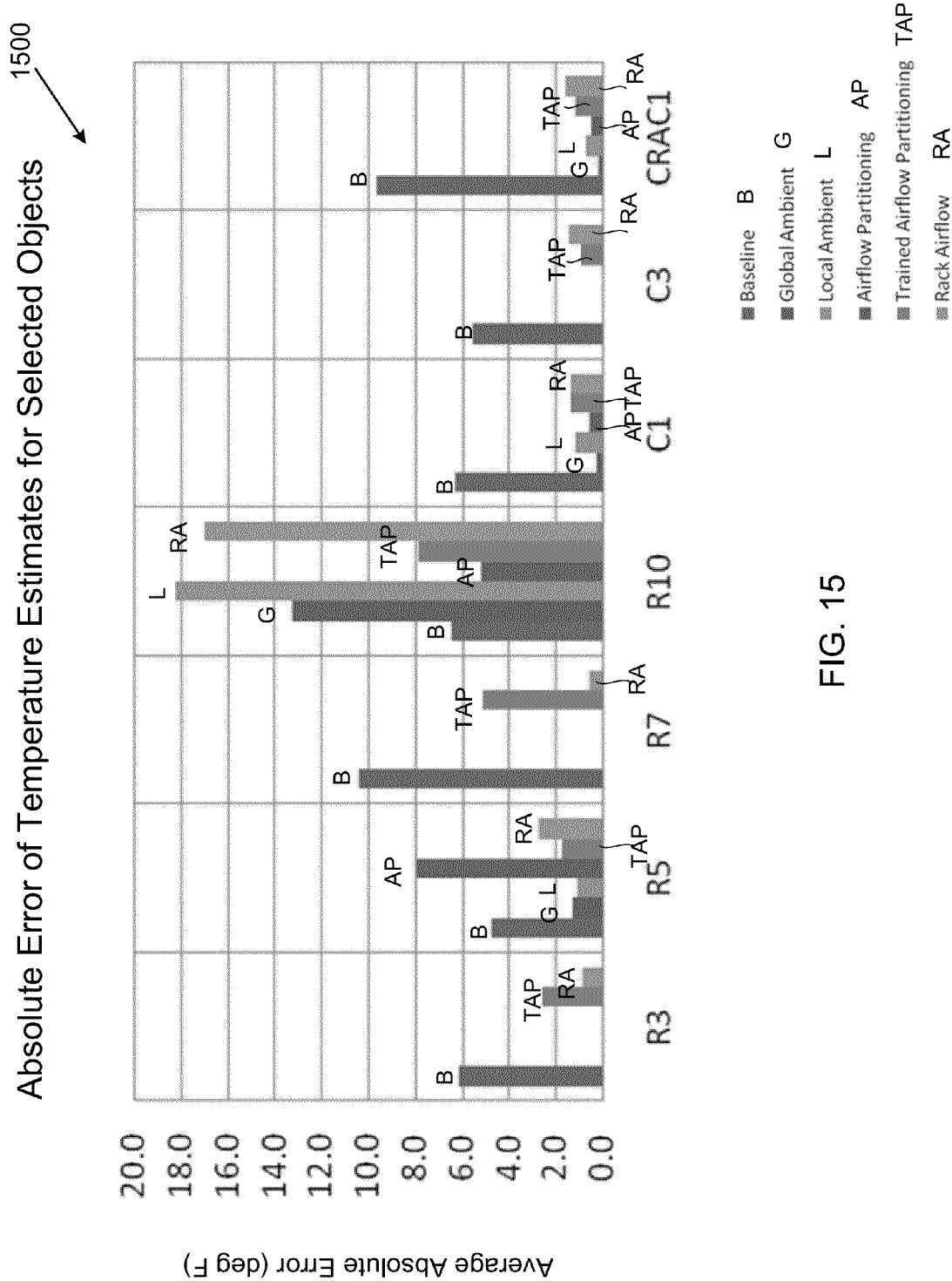
FIG. 15 is a bar graph comparing results of at least one process in accordance with one embodiment.

FIG. 15 is a graphical representation 1500 of the absolute error for specific airflow objects determined for each correction method. Similar to FIG. 14, the vertical axis of graph 1500 represents the absolute error and the horizontal axis represents racks R3, R5, R7, R10, coolers C1 and C3, and CRAC 1 of which racks R3, R7 and cooler C3 are measured. As shown in FIG. 15, the Baseline is labeled as B, the Global Ambient Correction as G, the Local Ambient Correction as L, the Basic Airflow Partitioning Correction as AP, the Trained Airflow Partitioning Correction as TAP and the Rack Airflow Correction as RA.

As illustrated in FIG. 15, the absolute error for the measured airflow objects (R3, R7 and C3) is reduced. The reduce absolute error for measured airflow objects is in accord with the example of FIG. 9, which shows improvement of temperature predictions for measured airflow objects. For measured racks R3, R7, and C3, the airflow partitioning AP and rack airflow correction RA methods may not match the temperatures precisely, but still reduce the absolute error by at least half in comparison with the Baseline B estimate. The same reduction is seen in the unmeasured cooler C1 and CRAC 1 objects. However, the correction methods for unmeasured racks R5 and R10 do not show consistent reduction in error. The absolute error for rack R5 is reduced for most of the correction methods (except airflow partitioning AP), while rack R10 shows poor performance in comparison with the baseline. In one embodiment, estimates for a particular rack can be conflicting after a number of predictive methods are used to calculate temperatures and airflows. To resolve these variable estimates, instrumentation can be placed on the rack to obtain measured data.

In embodiments above, processes and systems are provided that can determine relevant temperatures in a data center, and determine maximum cooler and rack capacities. The systems and methods can be used to provide optimized design of a data center by using results of the systems and methods to change the actual layout of equipment or the proposed layout of equipment. In processes described above, values related to data center cooling, including air flows and temperatures are determined. As readily understood by one of ordinary skill in the art, in at least some embodiments, the values determined are predictions for actual values that will occur in a data center having the parameters modeled. In methods of at least one embodiment of the invention, after successful modeling of a cluster in a data center, the results of the model may be used as part of a system to order equipment, ship equipment and install equipment in a data center as per the designed layout.

In addition, embodiments described herein provide methods and systems for determining airflow from perforated tiles of a below-floor plenum in a data center by incorporating tile airflow measurements into the room temperature model. The ability to predict airflow accurately in a data center design or management tool in embodiments of the invention facilitates designing robust plenum systems that exhibit good airflow uniformity under different perforated tile layout configurations. Further, embodiments facilitate avoiding costly trial-and-error solutions in a facility in attempts to achieve desired tile flow rates. Still further, better accuracy in tile airflow predictions results in improved overall data center cooling analysis and can provide a more energy efficient cooling solution. In at least some embodiments described herein, airflow in a plenum is described as being generated by a CRAC. Systems and methods described herein can be used with other types of sources of air in plenums, including other types of cooling devices and fans. In at least some embodiments, methods are described as determining specific airflows. In at least some embodiments, the determination is a prediction or estimation of actual airflows.

In at least some embodiments of the invention discussed herein, the performance of assessments and calculations in real-time refers to processes that are completed in a matter of a few seconds or less rather than several minutes or longer as can happen with complex calculations, such as those involving typical CFD calculations.

In at least some embodiments described above, the design of a data center and/or actual parameters in a data center are altered based on predicted perforated tile airflow in a data center. For example, a user of the data center design and management system may change the location of perforated tiles or the types of tiles that are used in the actual layout of equipment or the proposed layout of equipment in the data center. These alterations may be implemented to improve the cooling performance and/or may be implemented to provide cost and/or power savings when the performance is found to be within predetermined specifications. Further, based on determined airflow values, a data management system in accordance with one embodiment, may control one or more CRACs to adjust the airflow, and in addition, one or more equipment racks can be controlled to reduce power if the airflow from perforated tiles is not adequate to provide sufficient cooling.

In at least some embodiments described above, tools and processes are provided for determining perforated tile airflow in a data center. In other embodiments, the tools and processes may be used in other types of facilities, and may also be used in mobile applications, including mobile data centers. Further, processes and systems in accordance with embodiments described herein may be used in overhead air plenums, and other types of air plenums. Still further, while embodiments are described as being used with plenums having perforated tiles, other embodiments in accordance with the invention may be used with other types of openings or vents in a plenum for distributing air from the plenum. The term opening as used herein may include a single open area of a plenum such as a vent, a group of vents closely spaced together to effectively act as one opening, or a single perforated tile having many individual open areas.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A computer-implemented method for evaluating cooling performance of equipment in a data center, the equipment including a plurality of equipment racks and at least one cooling provider, the method comprising:
   receiving a plurality of measured inlet air temperature and exhaust air temperature values for the at least one cooling provider and a subset of the plurality of equipment racks;
   implementing a cooling model, the cooling model including:
      an ambient air temperature value;
      a plurality of inlet air temperature and exhaust air temperature values for the plurality of equipment racks and the at least one cooling provider; and
      a plurality of airflow values for the plurality of equipment racks and the at least one cooling provider;
   adjusting the ambient air temperature value and each airflow value of the plurality of airflow values in the cooling model;
   adjusting the cooling model to compensate for the adjusted ambient air temperature value and each airflow value of the plurality of airflow values in the cooling model;
   substituting a first subset of the plurality of inlet air temperature and exhaust air temperature values in the cooling model with the plurality of measured inlet air temperature and exhaust air temperature values; and
   predicting a second subset of the plurality of inlet air temperature and exhaust air temperature values for the plurality of equipment racks and the at least one cooling provider in the cooling model;
   wherein adjusting the cooling model to compensate for each adjusted airflow value of the plurality of airflow values includes determining a set of factors for the plurality of airflow values, wherein the set of factors reduces a difference between the plurality of measured inlet air temperature and exhaust air temperature values and the second subset of the plurality of inlet air temperature and exhaust air temperature values.

2. The computer implemented method of claim 1, wherein adjusting the cooling model to compensate for the adjusted ambient air temperature value comprises:
   establishing an equal ambient air temperature value for each equipment rack of the plurality of equipment racks and the at least one cooling provider; and
   including an airflow between the at least one cooling provider and each of the equipment racks.

3. The computer implemented method of claim 1, further including determining whether the inlet air temperature and exhaust air temperature values of each equipment rack of the plurality of equipment racks and the at least one cooling provider pass error checking as a result of adjusting the cooling model.

4. The computer implemented method of claim 1, wherein adjusting the cooling model to compensate for the adjusted ambient air temperature value comprises establishing different ambient air temperature values for each equipment rack of the plurality of equipment racks and the at least one cooling provider.

5. The computer implemented method of claim 1, wherein adjusting the cooling model to compensate for each adjusted airflow value of the plurality of airflow values further includes adjusting each airflow percentage value of a plurality of airflow percentage values.

6. The computer implemented method of claim 5, wherein adjusting each airflow percentage value of the plurality of airflow percentage values further includes determining a set of factors for the plurality of airflow percentage values, wherein the set of factors reduces a difference between the plurality of measured inlet air temperature and exhaust air temperature values and the second subset of the plurality of inlet air temperature and exhaust air temperature values.

7. The computer implemented method of claim 5, wherein receiving the plurality of measured inlet air temperature and exhaust air temperature values includes receiving a plurality of historically measured inlet air temperature and exhaust air temperature values and adjusting each airflow percentage value further includes determining a set of factors for the plurality of airflow percentage values, wherein the set of factors reduces a difference between the plurality of historically measured inlet air temperature and exhaust air temperature values and the second subset of the plurality of inlet air temperature and exhaust air temperature values.

8. The computer implemented method of claim 1, further including:
   receiving a plurality of measured airflow values for each perforated tile of a plurality of perforated tiles;
   determining a plurality of estimated airflow values for each perforated tile;
   calculating a ratio between the plurality of measured airflow values and the plurality of estimated airflow values; and
   adjusting a leakage factor until a difference between a subset of the plurality of measured airflow values and a subset of the plurality of estimated airflow values reaches a threshold.

9. The computer implemented method of claim 8, wherein adjusting the leakage factor further includes determining a damping parameter based on a confidence parameter and a uniformity parameter.

10. A system for evaluating equipment in a data center, the equipment including a plurality of equipment racks, and at least one cooling provider, the system comprising:
   an interface; and
   a controller coupled to the interface and configured to:
      receive a plurality of measured inlet air temperature and exhaust air temperature values for the at least one cooling provider and a subset of the plurality of equipment racks;
      implement a cooling model, the cooling model including an ambient air temperature value, a plurality of inlet air temperature and exhaust air temperature values for the plurality of equipment racks and the at least one cooling provider, and a plurality of airflow values for the plurality of equipment racks and the at least one cooling provider;
      adjust the ambient air temperature value and each airflow value of the plurality of airflow values in the cooling model;

adjust the cooling model to compensate for the adjusted ambient air temperature value and each airflow value of the plurality of airflow values in the cooling model;

substitute a first subset of the plurality of inlet air temperature and exhaust air temperature values in the cooling model with the plurality of measured inlet air temperature and exhaust air temperature values; and predict a second subset of the plurality of inlet air temperature and exhaust air temperature values for the plurality of equipment racks and the at least one cooling provider in the cooling model;

wherein the controller is further configured to adjust each airflow value of the plurality of airflow values by determining a set of factors for the plurality of airflow values, wherein the set of factors reduces a difference between the plurality of measured inlet air temperature and exhaust air temperature values and the second subset of the plurality of inlet and exhaust air temperature values.

11. The system of claim 10, wherein the controller is further configured to adjust the ambient air temperature value by including an equal ambient air temperature value for each equipment rack of the plurality of equipment racks and the at least one cooling provider and by including an airflow between the at least one cooling provider and each of the equipment racks in the ambient air temperature value.

12. The system of claim 10, wherein the controller is further configured to determine whether the inlet air temperature and exhaust air temperature values of each equipment rack of the plurality of equipment racks and the at least one cooling provider pass error checking as a result of adjusting the cooling model.

13. The system of claim 10, wherein the controller is further configured to adjust the ambient air temperature value by including different ambient air temperature values for each equipment rack of the plurality of equipment racks and the at least one cooling provider.

14. The system of claim 10, wherein the plurality of airflow values includes a plurality of airflow percentage values.

15. The system of claim 14, wherein the controller is further configured to determine a set of factors for the plurality of airflow percentage values, wherein the set of factors reduces a difference between the plurality of measured inlet air temperature and exhaust air temperature values and the second subset of the plurality of inlet air temperature and exhaust air temperature values.

16. The system of claim 14, wherein the measured inlet air temperature and exhaust air temperature values include a plurality of historically measured inlet air temperature and exhaust air temperature values and the controller is further configured to adjust the plurality of airflow percentage values by determining a set of factors for the airflow percentage values, wherein the set of factors reduces a difference between the plurality of historically measured inlet air temperature and exhaust air temperature values and the second subset of the plurality of inlet air temperature and exhaust air temperature values.

17. The system of claim 10, wherein the controller is further configured to receive a plurality of measured airflow values for each perforated tile of a plurality of perforated tiles;

determine a plurality of estimated airflow values for each perforated tile;

calculate a ratio between the plurality of measured airflow values and the plurality of estimated airflow values; and adjust a leakage factor until a difference between a subset of the plurality of measured airflow values and a subset of the plurality of estimated airflow values reaches a threshold.

18. A non-transitory computer readable medium having stored thereon sequences of instruction including instructions that will cause a processor to:

receive a plurality of measured inlet air temperature and exhaust air temperature values for the at least one cooling provider and a subset of the plurality of equipment racks;

implement a cooling model, the cooling model including an ambient air temperature value, a plurality of inlet air temperature and exhaust air temperature values for the plurality of equipment racks and the at least one cooling provider, and a plurality of airflow values for the plurality of equipment racks and the at least one cooling provider;

adjust the ambient air temperature value and each airflow value of the plurality of airflow values in the cooling model;

adjust the cooling model to compensate for the adjusted ambient air temperature value and each airflow value of the plurality of airflow values in the cooling model;

substitute a first subset of the plurality of inlet air temperature and exhaust air temperature values in the cooling model with the plurality of measured inlet air temperature and exhaust air temperature values; and predict a second subset of the plurality of inlet air temperature and exhaust air temperature values for the plurality of equipment racks and the at least one cooling provider in the cooling model;

wherein the instructions causing the processor to adjust the cooling model to compensate for each adjusted airflow value of the plurality of airflow values further include determining a set of factors for the plurality of airflow values, wherein the set of factors reduces a difference between the plurality of measured inlet air temperature and exhaust air temperature values and the second subset of the plurality of inlet air temperature and exhaust air temperature values.

\* \* \* \* \*

UNITED STATES PATENT AND TRADEMARK OFFICE
CERTIFICATE OF CORRECTION

| | | |
|---|---|---|
| PATENT NO. | : 8,725,307 B2 | Page 1 of 1 |
| APPLICATION NO. | : 13/171152 | |
| DATED | : May 13, 2014 | |
| INVENTOR(S) | : Christopher M. Healey et al. | |

It is certified that error appears in the above-identified patent and that said Letters Patent is hereby corrected as shown below:

In the Claims:

At Column 35, claim 10, line 18, insert --air temperature-- between "inlet" and "and".

Signed and Sealed this
Ninth Day of December, 2014

Michelle K. Lee
*Deputy Director of the United States Patent and Trademark Office*